(12) United States Patent
Gallagher et al.

(10) Patent No.: US 12,153,108 B2
(45) Date of Patent: *Nov. 26, 2024

(54) MAGNET CONFIGURATIONS

(71) Applicant: NANALYSIS CORP., Calgary (CA)

(72) Inventors: Neal Gallagher, Calgary (CA); Garett M. Leskowitz, Calgary (CA)

(73) Assignee: NANALYSIS CORP., Calgary (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/318,355

(22) Filed: May 16, 2023

(65) Prior Publication Data

US 2023/0314538 A1 Oct. 5, 2023

Related U.S. Application Data

(63) Continuation of application No. 17/637,575, filed as application No. PCT/CA2020/051158 on Aug. 24, 2020, now Pat. No. 11,815,574.

(Continued)

(51) Int. Cl.
| | | |
|---|---|---|
| *G01R 33/383* | (2006.01) | |
| *H01F 7/02* | (2006.01) | |
| *H01F 41/02* | (2006.01) | |

(52) U.S. Cl.
CPC ......... *G01R 33/383* (2013.01); *H01F 7/0294* (2013.01); *H01F 41/0253* (2013.01)

(58) Field of Classification Search
None
See application file for complete search history.

(56) References Cited

U.S. PATENT DOCUMENTS

| | | | | |
|---|---|---|---|---|
| 3,422,019 A | * | 1/1969 | Vinal | C04B 35/26 |
| | | | | 252/62.64 |
| 5,148,138 A | | 9/1992 | Miyata | |

(Continued)

FOREIGN PATENT DOCUMENTS

| | | | | |
|---|---|---|---|---|
| DE | 112012003269 T5 | * | 6/2014 | ........... G01R 33/383 |
| EP | 1378920 | | 1/2004 | |

(Continued)

OTHER PUBLICATIONS

Soltner, H. et al., "Dipolar Halbach Magnet Stacks Made from Identically Shaped Permanent Magnets for Magnetic Resonance," Concepts in Magnetic Resonance Part A, No. 4, 2010, pp. 211-222, EBSCOhost, DOI 10.1002/cmr.a.20165, URL: https://doi.org/10.1002/cmr.a.20165.

(Continued)

*Primary Examiner* — Rodney E Fuller
(74) *Attorney, Agent, or Firm* — Merchant & Gould P.C.

(57) ABSTRACT

A magnet array is disclosed comprising a plurality of polyhedral magnets arranged in a Halbach cylinder configuration, the centers of individual ones of the plurality of polyhedral magnets being arranged substantially in a plane in a magnet rack, the plurality of the polyhedral magnets at least partly enclosing a testing volume, and comprising a first plurality of polyhedral magnets arranged in a Halbach cylinder configuration and a second plurality of polyhedral magnets arranged in a non-Halbach configuration. In another aspect, a magnet array is disclosed comprising a first subset and a second subset of polyhedral magnets having different coercivities. In yet another aspect, a magnet array is disclosed wherein a subset of the centers of the individual ones of the plurality of polyhedral magnets are laterally displaced from a nominal position in the magnet rack to counteract a magnetic field gradient of the magnet array.

23 Claims, 20 Drawing Sheets

Related U.S. Application Data

(60) Provisional application No. 62/891,336, filed on Aug. 24, 2019.

(56) References Cited

U.S. PATENT DOCUMENTS

| | | | |
|---|---|---|---|
| 5,319,340 | A | 6/1994 | Leupold |
| 8,712,706 | B2 | 4/2014 | Leskowitz et al. |
| 9,952,294 | B2 | 4/2018 | Leskowitz |
| 10,018,694 | B2 | 7/2018 | Vidarsson |
| 11,815,574 | B2 * | 11/2023 | Gallagher ............ G01R 33/383 |
| 2005/0086793 | A1 | 4/2005 | Ras et al. |
| 2006/0232368 | A1 * | 10/2006 | Gorshkov .......... G01R 33/3806 |
| | | | 335/306 |
| 2012/0013338 | A1 | 1/2012 | Sakellariou et al. |
| 2015/0061680 | A1 * | 3/2015 | Leskowitz ............ H01F 7/0278 |
| | | | 324/309 |
| 2017/0254866 | A1 | 9/2017 | Haenichen et al. |
| 2018/0313920 | A1 | 11/2018 | Sotgiu |
| 2020/0064424 | A1 | 2/2020 | Niemann et al. |
| 2020/0144876 | A1 | 5/2020 | Seltzer et al. |
| 2020/0176163 | A1 | 6/2020 | Haham Hay |

FOREIGN PATENT DOCUMENTS

| | | |
|---|---|---|
| JP | 2006-294851 | 10/2006 |
| WO | 2014/194408 | 12/2014 |
| WO | 2015/183379 A1 | 12/2015 |
| WO | 2017/019326 | 2/2017 |

OTHER PUBLICATIONS

Mahmoud Meribout et al., "Optimal Halbach Magnet Array Design for Portable NMR Targeting Multiphase Flow Metering Applications," IEEE Transactions on Magnetics, vol. 55, No. 1, Jan. 2019, 7 pages.

International Search Report and Written Opinion of PCT/CA2020/051158, Nov. 9, 2020, 14 pages.

The extended European search report of European Patent Application No. 20857738.7, dated Jul. 28, 2023, 17 pages.

Search Report under Section 17, issued in British Patent Application No. 2319313.9 (Jan. 8, 2024).

* cited by examiner

MAGNET CONFIGURATIONS

CROSS-REFERENCE TO RELATED APPLICATIONS

This application claims priority of U.S. provisional patent application 62/891,336 filed on Aug. 24, 2019, the specification of which is hereby incorporated by reference in its entirety.

BACKGROUND

(A) Field

The present disclosure relates to magnet configurations. More particularly, it relates to modified Halbach magnet configurations.

(b) Related Prior Art

In a nuclear magnetic resonance (NMR) experiment, a sample for analysis is placed under the influence of a biasing static magnetic field, which partially aligns the sample's nuclear-spin magnetic moments. The moments precess in the static field at a frequency, called the Larmor frequency, which is proportional to the field strength. The magnetic moments of the sample can be manipulated by applying a transverse radio frequency (RF) magnetic field at the Larmor frequency. By observing the reaction of the sample to the RF field, insight into the chemical composition of the sample can be gained. The power of NMR as an analytical method may be largely a function of how well the characteristics of the applied magnetic fields can be controlled.

The practice of shimming magnetic fields (rendering the fields more uniform) has existed since the earliest days of NMR and originally used thin pieces of metal physically placed behind source magnets to adjust the positions of those magnets to refine the magnetic field. More modern shimming techniques use electro-magnetic coils. Conventional high-field magnetic resonance spectrometers commonly use shimming coils disposed on substantially cylindrical coil forms. In contrast, the use of shimming (shim) coils in compact NMR devices has proved difficult primarily due to space restrictions that may not accommodate traditional shim coil systems, which can have many layers. The space available inside a main magnet in many such devices may be too small to accommodate a typical set of shimming coils whose individual elements are each designed predominantly to address one and only one geometrical aspect or geometrical component of the residual inhomogeneity of the main magnetic field.

FIGS. 1A, 1B, and 1C compare the main biasing field and sample tube configurations of typical high-field spectrometer designs with a design for compact magnet systems that is based on a cylindrical Halbach array. The arrows labelled B indicate the main magnetic field direction. No shimming measures are shown in the figures. FIG. 1A schematically shows the superconducting field coils of the high-field magnet, an inserted cylindrical sample tube, and the field, B, produced by the coils. The magnetic field within the sample volume is aligned along the common symmetry axis of the coils and the tube.

FIGS. 1B and 1C show the same sample tube inserted into a cylindrical Halbach magnet array, which produces a field, B, perpendicular to the symmetry axis of the tube. This particular Halbach array is composed of eight magnets in a circular (as shown in FIG. 1B) arrangement placed around the tube, with the magnetization vectors of the magnets (shown as arrows) perpendicular to the tube's symmetry axis. The magnetization vector is a quantitative and directional representation of the polarization of magnetic dipoles in a material. The field inside the Halbach array is quite uniform for some applications but can be too inhomogeneous for some high-resolution NMR experiments.

In order to substantially reduce the inhomogeneity of a magnetic field, it may be helpful to have independent control over different geometrical aspects of the field inhomogeneity. In many magnetic resonance applications, the main magnetic field is strongly polarized along a specified direction. Within this application, as is common practice in the art, this direction is understood to be the z-axis in a Cartesian reference frame in which the origin is at some fixed point, for example near the center of a sample under study. The Larmor frequency of magnetic spins located at a point in space is determined by the magnitude of the field at that point, which in reasonably homogeneous fields is very well approximated by the z-component of the field, $B_z$. One can expand $B_z$ as a scaled sum of functions, $$B_z(x,y,z) = B_0 + \Sigma_k c_k f_k(x,y,z),$$

where k is a variable (or a number of variables) used to index the various functions, $f_k$, in the set, and where x, y, and z are Cartesian or other spatial coordinates defining positions within a volume enclosing at least part of the sample. $B_0$ is the large and spatially uniform part of the field, and the coefficients, $c_k$, quantify different components of the field inhomogeneity. Such sets of functions, for example x, z, xy, $(x^2-y^2)$ are said to be orthogonal (with respect to a specified scalar product of functions) if the scalar product between two functions that are not the same is zero. A common scalar product between two functions is the integral, $$\langle k_1 | k_2 \rangle = \int_V W(x,y,z) f_{k_1}(x,y,z) f_{k_2}^*(x,y,z) dV,$$

where V denotes a volume relevant to the functions over which the integral is calculated, where the star denotes complex conjugation, and where W denotes a weighting function defined on the volume, which quantifies how important the volume element at (x, y, z) is in its contribution to the integral.

For example, commonly, an expansion in spherical harmonic functions is used, where the functions are $$f_{n,m}(x,y,x) = N_{n,m} P_{n,m}(\cos \theta) \exp(im\phi),$$

where $$\theta = \tan^{-1}\left(\sqrt{x^2 + y^2}/z\right)$$

and $\phi = \tan^{-1}(y/x)$, where $P_{n,m}$ denotes a Legendre polynomial or associated Legendre function, and where $N_{n,m}$ are normalization factors. The functions are said to be "orthogonal over the unit sphere." Sometimes, real-valued linear combinations of the complex-valued spherical harmonic functions are used instead. If, in addition, the scalar product between each function $f_k$ and itself is equal to 1, then the set of functions is said to be orthonormal. Use of orthogonal or orthonormal functions can facilitate description and analysis of field imperfections and can be helpful in designing and implementing systems for control of the quality of the field in applications.

Well-controlled magnetic fields are particularly important in nuclear magnetic resonance (NMR) spectroscopy and other magnetic resonance (MR) applications. In many NMR spectroscopy experiments, a strong, static magnetic field is applied in a region of space that contains a sample under study, and it is desirable that this field be as spatially uniform as possible in order to observe important but subtle variations in the magnetic response of the sample. It is also desirable in many NMR applications to have a static magnetic field that is as strong as is practical.

At least three classes of magnets have been used to provide strong, static magnetic fields in NMR devices: superconducting electromagnets, resistive electromagnets, and permanent magnets. Permanent magnets or arrays (also called assemblies or configurations) thereof can be advantageous in applications where low cost, low maintenance and/or portability are desirable.

In practice, permanent magnets are often accompanied by pole pieces, which are pieces of magnetically permeable material placed in the vicinity of magnets in order to contribute to or shape a magnetic field. In some applications, it is desirable that materials used for pole pieces be magnetically "soft," that is, that they have a relatively low coercivity. It is also desirable in some applications that pole piece materials be strongly magnetized when placed in a magnetic field, that is, that they have a high saturation magnetization.

One design for producing a substantially strong magnetic field in a small volume is the Halbach cylinder, wherein magnetic dipoles within high-coercivity permanent magnet materials are arranged around a central cavity. FIG. 2 shows a cross-sectional view of an idealization of a Halbach cylinder 10, along with a coordinate system 12 that is used to compute and select the orientations of magnetic dipoles, shown as arrows 14, within a region surrounding a central volume 16. In the idealized Halbach cylinder, magnetization direction m is position-dependent according to the equation, $$\hat{m}(\rho,\varphi,z)=\cos(k\varphi)\hat{\rho}+\sin(k\varphi)\hat{\varphi},$$

in cylindrical polar coordinates $\rho$, $\varphi$, z, with integer parameter k=1 for the most prevalent case, which produces a substantially uniform field in the central volume 16. Other choices of k provide different, non-uniform field configurations. In practical implementations, discrete component magnets are used as an approximation to the continuously varying magnetization suggested by FIG. 2.

FIGS. 3A, 3B, 3C and 3D show example prior art implementations of Halbach-cylinder-based magnet configurations. FIG. 3A (adapted from F. Bertora, A. Trequattrini, M. G. Abele, and H. Rusinek, "Shimming of yokeless permanent magnets designed to generate uniform fields," Journal of Applied Physics 73, 6864, 1993) shows a cylindrical configuration of magnets designated 20 surrounding space 24, that makes efficient use of space and employs many oblique shapes 21, 22, 23 in its design.

FIG. 3B (adapted from E. Danieli, J. Mauler, J. Perlo, B. Blumich, and F. Casanova, "Mobile sensor for high resolution NMR spectroscopy and imaging, Journal of Magnetic Resonance 198, 80, 2009) shows an array 30 that uses permanent magnets of the same cubic shape 31 to enclose space 32. However, this implementation suffers from low packing density.

When the space surrounding a central volume is broken up into regions, the individual component magnets placed therein may exhibit oblique shapes, such as those shown in FIG. 3A, that are difficult or expensive to fabricate with high tolerance. The magnetizations required within the component magnets may also be difficult to control with precision sufficient to ensure the quality of the magnetic field within the central volume. If, instead, simpler component magnets such as cubes are used, as in FIG. 3B, these can be fabricated and magnetized with high precision straightforwardly, but the geometrical constraints for some designs can result in a low packing density, with an attendant reduction in the field strength that can be produced.

FIG. 3C is a cross section of an embodiment of a Halbach cylinder 40 comprising an array of closely packed hexagonal prisms 41 surrounding central space 42, disclosed in U.S. Pat. No. 8,712,706 to Leskowitz, et al., incorporated herein by reference in its entirety. FIG. 3D (also disclosed in U.S. Pat. No. 8,712,706), shows the general arrangement 50 of individual main magnets 52 in a magnet array around a channel 53 in which pole pieces 54 and a sample 56 are positioned. FIG. 3D also illustrates the positioning of shim panels 58 on the pole pieces 54. Arrows 59 show the predominant magnetization directions of each main magnet 52 in the arrangement.

In a Halbach cylinder model, the ideal is an infinitely long cylinder. In practice, the cylinder is of finite length, which can lead to various technical problems and undesirable features in the primary magnetic field of the array, and designs attempting to overcome these disadvantages can be complex. An alternative approach for producing homogeneous fields uses a Halbach sphere, practical embodiments of which have been suggested by H. Leupold in U.S. Pat. No. 4,837,542.

FIG. 4A, adapted from U.S. Pat. No. 9,952,294 to Leskowitz, incorporated herein by reference in its entirety, shows a sphere 60 enclosing a central cavity 62 and having local magnetic dipole orientations 64. Once a desired magnetic field axis, D, is selected, the required magnetization directions for the component magnets in the assembly can be calculated by establishing a spherical polar coordinate system 66 with colatitude angle $\theta$=0 along the magnetic field direction D, then calculating the magnetization direction $\hat{m}$ for the given magnet's center coordinates according to formulas disclosed in U.S. Pat. No. 9,952,294 to Leskowitz.

In order to best approximate a uniform field in the idealized case, magnetization direction $\hat{m}$ within the spherical shell surrounding the central cavity is position-dependent according to the equation, $$\hat{m}(r,\theta,\varphi)=\cos(k\theta)\hat{r}+\sin(k\theta)\hat{\theta},$$

in spherical polar coordinates r, $\theta$, $\phi$, again with parameter k=1 for the uniform-field case.

It will be observed that magnetization in the spherical case differs from the magnetization in the cylindrical case. In the Halbach sphere model, the magnetization of the dipole at a position $\vec{r}=r\vec{r}$ lies in the meridional plane spanned by $\hat{r}$ and $\hat{\theta}$, but in the Halbach cylinder model, the magnetization lies in a plane spanned by $\hat{\rho}=(r\hat{r}-z\hat{z})/\rho$, the unit vector directed away from the cylindrical symmetry axis, and $\hat{\phi}$, the azimuthal unit vector. In the idealized Halbach cylinder case, the magnetization direction has no $\hat{z}$ component (along the cylindrical symmetry axis) and is independent of the z coordinate of the dipole's position. A variety of numerical representations of such position-dependent magnetizations are possible and will be readily identified and understood.

Spherical assemblies can be composed of combinations of magnets having complex shapes, as illustrated in FIG. 4B (adapted from U.S. Pat. No. 4,837,542 to Leupold). In FIG. 4B it will be seen that the sphere 70 comprises multiple component primary magnets 72 having chosen dipole orientations 74 and surrounding central cavity 76. In order to achieve the desired configuration and field, a large number of different primary magnets having different shapes and magnetic orientations is required. Again, these can be challenging or impractical to fabricate with high tolerance.

Magnet arrays and methods for generating magnetic fields are disclosed in U.S. Pat. No. 9,952,294 to Leskowitz, including a magnet array comprising a plurality of polyhedral magnets arranged in a lattice configuration and at least partly enclosing a testing volume, the magnet array having an associated magnetic field with a designated field direction D, wherein the magnetization direction $\hat{m}$ of an individual polyhedral magnet located at a displacement vector $\vec{r}$ from an origin point in the testing volume is determined by the formula:

$$\hat{m}=(2(\hat{v}\cdot\vec{r})\hat{r}-(\vec{r}\cdot\vec{r})\hat{v})/(\vec{r}\cdot\vec{r}).$$

In embodiments the polyhedral magnets 101 are truncated cubes, and the magnet array 100 is based on a simple cubic lattice, as illustrated in FIG. 4C (adapted from U.S. Pat. No. 9,954,294 to Leskowitz). As will be seen in FIG. 4C, some of the polyhedral magnets 101 comprised in the lattice configuration making up the magnet array 100 are larger first magnets 103 and others are smaller second magnets 106. The smaller second magnets 106 form composite magnets 104 at particular sites in the array. As will be seen in FIG. 4C, the use of such smaller second magnets 106 is exploited to provide a sample channel 107, in this case oriented along a body diagonal of the array.

In practice, a Halbach sphere configuration can produce a magnetic field that is larger than that produced by a Halbach cylinder configuration. However, Halbach sphere configurations can suffer from limited access to the central region of the magnet compared to Halbach cylinder configurations.

In applications such as magnetic resonance applications, it may be advantageous to use the largest magnetic fields that are practical. One way to increase the field present inside a Halbach cylinder magnet configuration is to insert pole pieces into the bore of the Halbach cylinder magnet configuration. U.S. Pat. No. 9,341,690 to Leskowitz and McFeetors discloses shaped pole pieces in a cylindrical Halbach magnet configuration. While inserting pole pieces into a cylindrical Halbach magnet may increase the field, it may also create or exacerbate deleterious magnetic field gradients, including quadratic field gradients. This can be partially mitigated by forming the pole pieces so that each has a channel on its rear face, that is, a first face of the pole piece that is opposite a second face of the pole piece that is closest to the center of the Halbach cylinder, which may be configured as a sample location. A problem to be solved is that introducing this back channel in the pole piece can reduce the field strength within the sample location, because magnetic material is effectively removed in forming the channel.

Another way to increase the field present inside a Halbach cylinder magnet configuration is to increase the number of component magnets that are used to constitute the magnet configuration. Such component magnets may be configured in concentric ring structures. For example, FIG. 3D exhibits a single hexagonal ring of six magnets, and FIG. 3C exhibits a hexagonal ring of six magnets surrounded by a hexagonal ring of twelve magnets. It will be readily appreciated that each component magnet is subject to magnetic interaction with the total magnetic field generated by all the other magnets in an assembly. In particular, a component magnet may be located at a site where the total magnetic field generated by the other magnets is substantially aligned with the magnetization of said component magnet. In that case, said component magnet would be under relatively low coercive stress and would therefore be subject to a weak demagnetizing force. Conversely, a component magnet may be located at a site where the total magnetic field generated by the other magnets is substantially aligned away from or opposing the magnetization of said component magnet. In that case, said component magnet would be under relatively high coercive stress and would therefore be subject to a strong demagnetizing force. Mitigating or controlling demagnetizing forces is a critical issue in determining the stability and performance of magnet arrays in applications. Moreover, elevated coercivity can be associated with increased cost.

There remains a need for a solution that allows for increased magnetic fields while maintaining the low-cost, convenience, and manufacturability of cylindrical and spherical Halbach magnet configurations.

SUMMARY

The present disclosure describes modified Halbach magnet configurations. In this disclosure, magnet configurations may also be called magnet arrays or magnet assemblies. The term "modified" Halbach magnet configuration means a configuration (or arrangement) of individual component magnets that comprises two or more subsets of magnets, at least one subset being configured in a Halbach cylinder magnet configuration and at least one other subset having another (non-Halbach) magnet configuration as discussed in this disclosure. Further, the modified Halbach magnet configurations are understood to in some way increase the strength, the uniformity, or both, of the magnetic field produced by the magnet configuration.

Embodiments in this disclosure in which Halbach magnet configurations have been changed comprise magnet configurations having at least two groups of polyhedral magnets, one group arranged in a Halbach cylinder configuration and one group arranged in a non-Halbach cylinder configuration. Other embodiments in this disclosure comprise magnet configurations having at least two groups of polyhedral magnets having different magnetic coercivities. Further embodiments in this disclosure in which Halbach magnet configurations have been changed comprise magnet configurations having polyhedral magnets arranged in a Halbach cylinder configuration and wherein a subset of the polyhedral magnets are laterally displaced from a nominal position to counteract a magnetic field gradient of the magnet configuration. Even further embodiments in this disclosure in which Halbach cylinder magnet configurations have been changed comprise magnet configurations having composite polyhedral magnets, each of whose component magnets has its own magnetization vector orientation. These modified Halbach magnet configurations may provide an increased magnetic field produced by the magnet configuration and may influence (emphasize or de-emphasize) magnetic field gradients, including magnetic field gradients generated by introducing one or more pole pieces into the magnet configuration. These modified Halbach magnet configurations provide a solution that allows for increased magnetic fields while accounting for cost, convenience, and manufacturability.

In one aspect there is provided a magnet array comprising: a first plurality of polyhedral magnets arranged in a Halbach cylinder configuration, the centers of individual ones of the plurality of polyhedral magnets arranged substantially in a plane in a magnet rack of the magnet array, the plurality of polyhedral magnets at least partly enclosing a testing volume; and a second plurality of polyhedral magnets in the magnet rack, the second plurality of magnets arranged in a non-Halbach configuration.

In an embodiment, the second plurality of polyhedral magnets in the magnet rack comprising magnets having an in-plane magnetization vector, an out-of-plane magnetization vector, or a combination thereof.

In an embodiment, the magnet array has an associated magnetic field with a designated field direction $\hat{v}$, wherein the magnetization direction $\hat{m}$ of at least one of the second plurality of polyhedral magnets located at a displacement vector $\vec{r}$ from an origin point in the testing volume is determined by the formula:

$$\hat{m}=(2(\hat{v}\cdot\vec{r})\hat{r}-(\vec{r}\cdot\vec{r})\hat{v})/(\vec{r}\cdot\vec{r})$$

where $\hat{r}$ is the unit vector pointing along $\vec{r}$.

In an embodiment, individual ones of said polyhedral magnets are selected from the group consisting of: a truncated cube, a rhombic dodecahedron, a Platonic solid, an Archimedean solid, a Johnson solid, a prism, a chamfered polyhedron, and a truncated polyhedron.

In an embodiment, the second plurality of polyhedral magnets comprising magnets that are obliquely edge magnetized, obliquely vertex magnetized, axially magnetized, or a combination thereof.

In an embodiment, the first plurality of magnets comprising magnets that are diametrically face magnetized, diametrically edge magnetized, or a combination thereof.

In an embodiment, the first and second pluralities of polyhedral magnets are hexagonal prismatic magnets.

In an embodiment, the magnet array comprises a plurality of magnet racks arranged in a rack stack. In an embodiment, The magnet array comprises four magnet racks. In another embodiment, the magnet array comprises comprising five magnet racks.

In an embodiment, the magnet racks each comprise thirty-six hexagonal prismatic magnets.

In an embodiment, the thirty-six hexagonal prismatic magnets arranged in inner, middle, and outer rings of six, twelve and eighteen hexagonal prismatic magnets, respectively, wherein the inner hexagonal prismatic magnets are closest to the testing volume.

In an embodiment, the magnet rack comprises a cell framework and a framework housing.

In an embodiment, the magnet rack and the first and second pluralities of polyhedral magnets each have a height of 1.5".

In an embodiment, cells in the cell framework having a width of 1.25" and walls of the cell framework having a thickness of 0.030".

In an embodiment, the first plurality of polyhedral magnets comprise the inner and middle rings of six and twelve hexagonal prismatic magnets, respectively.

In an embodiment, the second plurality of polyhedral magnets comprising positions in the outer ring of eighteen hexagonal prismatic magnets.

In an embodiment, at least one of the individual magnet racks in the rack stack comprises twenty-two diametrically face magnetized magnets, eight obliquely vertex magnetized magnets, four obliquely edge magnetized magnets, and two axially magnetized magnets.

In an embodiment, a first magnet rack arranged above a central magnetic reflection plane of the rack stack has a first magnet configuration that is a magnetic reflection of a second magnet configuration of a second magnet rack arranged below the central magnetic reflection plane of the rack stack.

In an embodiment, a first of the five magnet racks in the rack stack has a magnet configuration that is a magnetic reflection of that of a fifth of the five magnet racks in the rack stack.

In an embodiment, the first plurality of polyhedral magnets in each of the first and fifth magnet racks comprising eighteen magnets having an in-plane magnetization vector, and the second plurality of polyhedral magnets in each of the first and fifth magnet racks comprising eighteen magnets having an out-of-plane magnetization vector.

In an embodiment, the eighteen in-plane magnetized magnets comprise fourteen diametrically face magnetized magnets and four diametrically edge magnetized magnets.

In an embodiment, the eighteen magnets having an out-of-plane magnetization vector are axially magnetized.

In an embodiment, a second of the five magnet racks in the rack stack has a configuration that is a magnetic reflection of that of a fourth of the five magnet racks in the rack stack.

In an embodiment, the first and second pluralities of polyhedral magnets in each of the second, third and fourth magnet racks comprise magnets having an in-plane magnetization vector.

In an embodiment, each of the second and fourth magnet racks comprise twenty-eight diametrically face magnetized magnets and eight diametrically edge magnetized magnets.

In an embodiment, the third magnet rack comprises twenty diametrically face magnetized magnets and sixteen diametrically edge magnetized magnets.

In an embodiment, the magnet array further comprises a first subset of polyhedral magnets and a second subset of polyhedral magnets, wherein the first subset and the second subset of polyhedral magnets have different magnetic coercivities.

According to another aspect there is provided a magnet array comprising: a first plurality of polyhedral magnets arranged in a Halbach cylinder configuration, the centers of individual ones of the plurality of polyhedral magnets arranged substantially in a plane in a magnet rack of the magnet array, the plurality of polyhedral magnets at least partly enclosing a testing volume; a second plurality of polyhedral magnets in the magnet rack, the second plurality of magnets arranged in a non-Halbach configuration; and at least one composite magnet.

In an embodiment, the at least one composite magnet includes two or more magnets each having a different magnetization vector and the two or more magnets are together sized and shaped to be positioned in an individual cell of the magnet array.

In an embodiment, the magnet array further comprises at least one composite magnet.

In an embodiment, the at least one composite magnet is a hexagonal prismatic magnet.

In an embodiment, the at least one composite magnet includes two magnets each having a different magnetization vector.

In an embodiment, the at least one composite magnet includes more than two magnets each having a different magnetization vector.

In an embodiment, the magnetization vectors are selected from the group consisting of: diametrically face magnetized, diametrically edge magnetized, obliquely edge magnetized, obliquely vertex magnetized, and axially magnetized.

In an embodiment, the two or more magnets are together sized and shaped to be positioned in an individual cell of the magnet array.

According to a further aspect there is provided a magnetic resonance device comprising a magnet array comprising a first plurality of polyhedral magnets arranged in a Halbach cylinder configuration, the centers of individual ones of the plurality of polyhedral magnets being arranged substantially in a plane in a magnet rack of the magnet array, the plurality of polyhedral magnets at least partly enclosing a testing volume, and a second plurality of polyhedral magnets in the magnet rack, the second plurality of magnets arranged in a non-Halbach configuration.

According to another aspect there is provided a method for assembling a magnet array, comprising: providing a first plurality of polyhedral magnets; arranging the first plurality of polyhedral magnets in a Halbach cylinder configuration in a magnet rack, the centers of individual ones of the plurality of polyhedral magnets being arranged substantially in a plane in the magnet rack, the plurality of polyhedral magnets at least partly enclosing a testing volume; providing a second plurality of polyhedral magnets; arranging the second plurality of polyhedral magnets in a non-Halbach configuration in the magnet rack; and arranging the magnet rack in a rack stack to assemble the magnet array.

According to another aspect there is provided a magnet array comprising: a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities.

In an embodiment, individual ones of the polyhedral magnets in the first subset have similar magnetic coercivities.

In an embodiment, the magnet array comprises one or more further subsets of polyhedral magnets, wherein each of the subsets of polyhedral magnets have different magnet coercivities, and the individual ones of the polyhedral magnets within each subset have similar magnet coercivities.

In an embodiment, the individual ones of the polyhedral magnets in a given subset are said to have similar magnetic coercivities relative to one another when a variation in magnetic coercivities associated with the individual ones of the polyhedral magnets in the given subset does not exceed 5% and preferably does not exceed 2%.

In an embodiment, two or more polyhedral magnets or subsets of polyhedral magnets are said to have different magnetic coercivities when a difference between the magnetic coercivities exceeds a threshold of 10% and preferably exceeds a threshold of 20%.

In an embodiment, the first subset of polyhedral magnets has a higher coercivity than the second subset of polyhedral magnets.

In an embodiment, the first subset of polyhedral magnets having the higher coercivity is positioned closer to the testing volume and the second subset of polyhedral magnets having the lower coercivity is positioned farther from the testing volume.

In an embodiment, the number of polyhedral magnets and the location in the magnet array of the polyhedral magnets in the first subset and the second subset are selected according to a simulation.

In an embodiment, the magnet array comprises thirty-six polyhedral magnets arranged in inner, middle, and outer rings of six, twelve and eighteen hexagonal prismatic magnets, respectively, and with four to six of the inner hexagonal prismatic magnets being closest to the testing volume and having the highest coercivity.

In an embodiment, each one of the plurality of polyhedral magnets has an intrinsic coercivity $H_{c,i}$ that exceeds a threshold coercivity $H_T$.

In an embodiment, selection of individual ones of the polyhedral magnets defining the first subset and the second subset is based on symmetry considerations associated with magnet positions in the magnet array.

In an embodiment, at least a portion of the polyhedral magnets are arranged in a Halbach configuration.

According to further aspect there is provided a method of determining a threshold coercivity for one or more magnets in a magnet array comprising a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subsect of polyhedral magnets have different magnetic coercivities, the method comprising:

a. simulating an initial arrangement of the plurality of polyhedral magnets in the magnet array, each individual polyhedral magnet having a given magnet array position and an initial magnetization vector orientation;

b. choosing a set of points $\vec{r}$ within the volume of at least one individual polyhedral magnet in the magnet array;

c. simulating, for the at least one individual polyhedral magnet, a magnetic field intensity $\vec{H}(\vec{r})$ at each one of the points in the set $\vec{r}$, and assigning a magnetization $\vec{M}(\vec{r})$ at each one of the points in the set $\vec{r}$;

d. calculating a dot product $\vec{H}(\vec{r}) \cdot \vec{M}(\vec{r})$ at each one of the points in the set $\vec{r}$;

e. selecting the minimum (most negative) value of the dot product $[\vec{H}(\vec{r}) \cdot \vec{M}(\vec{r})]_m$ for the at least one individual polyhedral magnet in the magnet array; and f. determining the threshold coercivity according to the formula $$H_T = -\mu_0 \frac{\left[\vec{H}(\vec{r}) \cdot \vec{M}(\vec{r})\right]_{min}}{\alpha(1 - k\Delta T)B_r}$$

for the at least one individual polyhedral magnet in the magnet array.

In an embodiment, the method further comprises before performing step a, determining one or more symmetry classes of the magnet array and assigning each of the plurality of polyhedral magnets in the magnet array to a corresponding one of the symmetry classes; and assigning the value of the threshold coercivity H_T determined in step f to all the magnets in the symmetry class associated with the at least one individual polyhedral magnet.

In an embodiment, each magnet position in a given symmetry class is related to other magnet positions in the same symmetry class by a symmetry element selected from the group consisting of: reflection plane, rotation axis, rotation-reflection axis, inversion center, magnetic reflection plane, magnetic rotation axis, magnetic rotation-reflection axis, and magnetic inversion center.

In an embodiment, the method further comprises identifying a maximum coercivity $H_{max}$ for the at least one individual polyhedral magnet; selecting an alternative $\vec{M}_{alt}$ to the initial magnetization vector orientation for the at least one individual polyhedral magnet if the threshold coercivity $H_T$ calculated in step f. exceeds the maximum coercivity $H_{max}$; and repeating steps b. through f.

According to another aspect, there is provided a method for assembling a magnet array, comprising: determining a threshold coercivity $H_T$ for each of the plurality of polyhedral magnets in the given magnet array positions in the magnet array; and arranging a set of polyhedral magnets in the magnet array, wherein each individual one of the set of polyhedral magnets has a coercivity exceeding the calculated threshold coercivity $H_T$ for the given magnet array positions to assemble the magnet array.

According to a further aspect, there is provided a magnetic resonance device comprising a magnet array comprising a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities.

According to a yet another aspect, there is provided a magnet array comprising: a plurality of polyhedral magnets arranged in a Halbach cylinder configuration, the centers of individual ones of the plurality of polyhedral magnets being arranged substantially in a plane in a magnet rack, the plurality of the polyhedral magnets at least partly enclosing a testing volume, and wherein a subset of the centers of the individual ones of the plurality of polyhedral magnets are laterally displaced from a nominal position in the magnet rack to counteract a magnetic field gradient of the magnet array.

In an embodiment, the magnet array comprises a pole piece. The pole piece may be adapted to produce the magnetic field gradient.

In an embodiment, the plurality of polyhedral magnets are hexagonal prismatic magnets.

In another embodiment, the magnet array comprises a plurality of magnet racks arranged in a rack stack. In one embodiment, the magnet array may include four magnet racks. In another embodiment, the magnet array may include five magnet racks.

In an embodiment, the magnet rack comprises thirty-six of the hexagonal prismatic magnets. The thirty-six hexagonal prismatic magnets may be arranged in inner, middle, and outer rings of six, twelve and eighteen hexagonal prismatic magnets, respectively, and with the inner hexagonal prismatic magnets being closest to the testing volume.

In an embodiment, the centers of two of the inner ring of six hexagonal prismatic magnets are laterally displaced from the nominal position in the magnet rack farther away from the testing volume and the centers of four of the inner ring of six hexagonal prismatic magnets are laterally displaced from the nominal position in the magnet rack closer to the testing volume.

In an embodiment, the magnet array may further comprise a first subset of polyhedral magnets and a second subset of polyhedral magnets, wherein the first subset and the second subset of polyhedral magnets have different magnetic coercivities.

In an embodiment, the subset of the centers of the individual ones of the plurality of polyhedral magnets that are laterally displaced from a nominal position in the magnet rack are positioned farther away from the testing volume.

In an embodiment, the subset of the centers of the individual ones of the plurality of polyhedral magnets that are laterally displaced from a nominal position in the magnet rack are positioned closer to the testing volume.

In an embodiment, a first portion of the subset of the centers of the individual ones of the plurality of polyhedral magnets that are laterally displaced from a nominal position in the magnet rack are positioned farther away from the testing volume, and a second portion of the subset of the centers of the individual ones of the plurality of polyhedral magnets that are laterally displaced from a nominal position in the magnet rack are positioned closer to the testing volume.

In another aspect there is provided a method for assembling a magnet array, comprising:
providing a plurality of polyhedral magnets;
providing a cell framework in a magnet rack of the magnet array, the cell framework for receiving the polyhedral magnets;
arranging the plurality of polyhedral magnets in in the cell framework in the magnet rack, the centers of individual ones of the plurality of polyhedral magnets being arranged substantially in a plane in the magnet rack, the plurality of the polyhedral magnets at least partly enclosing a testing volume, and wherein a subset of the centers of the individual ones of the plurality of polyhedral magnets are laterally displaced from a nominal position in the magnet rack to counteract a magnetic field gradient of the magnet array; and
arranging the magnet rack in a rack stack to assemble the magnet array.

According to a further aspect, there is provided a magnetic resonance device comprising a magnet array comprising a plurality of polyhedral magnets arranged in a Halbach cylinder configuration, the centers of individual ones of the plurality of polyhedral magnets being arranged substantially in a plane in a magnet rack, the plurality of the polyhedral magnets at least partly enclosing a testing volume, and wherein a subset of the centers of the individual ones of the plurality of polyhedral magnets are laterally displaced from a nominal position in the magnet rack to counteract a magnetic field gradient of the magnet array.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive, and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

In embodiments there is disclosed a magnet array is disclosed comprising a plurality of polyhedral magnets arranged in a Halbach cylinder configuration, the centers of individual ones of the plurality of polyhedral magnets being arranged substantially in a plane in a magnet rack, the plurality of the polyhedral magnets at least partly enclosing a testing volume, and comprising a first plurality of polyhedral magnets arranged in a Halbach cylinder configuration and a second plurality of polyhedral magnets arranged in a non-Halbach configuration. In another aspect, a magnet array is disclosed comprising a first subset and a second subset of polyhedral magnets having different coercivities. In yet another aspect, a magnet array is disclosed wherein a subset of the centers of the individual ones of the plurality of polyhedral magnets are laterally displaced from a nominal position in the magnet rack to counteract a magnetic field gradient of the magnet array.

The present invention will be more readily understood by referring to the following examples which are given to illustrate the invention rather than to limit its scope.

Figure 1A:
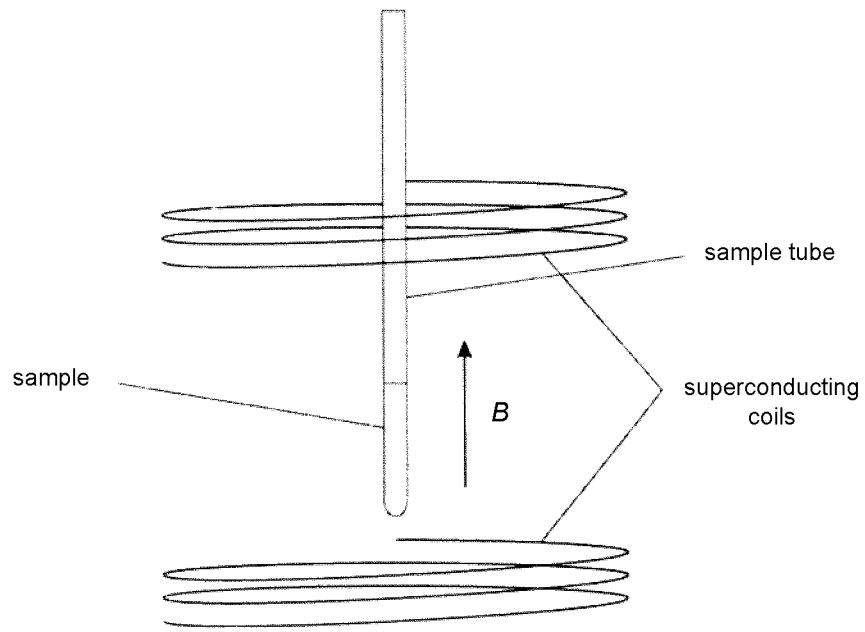
FIG. 1A is a schematic side view showing a sample tube in an arrangement of superconducting coils for producing a strong magnetic field aligned along a sample tube's symmetry axis.
Figure 1B:
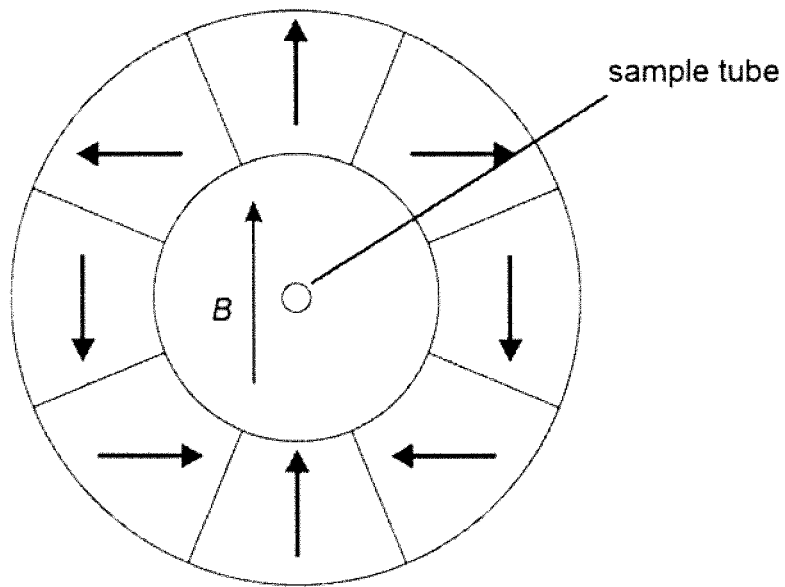
FIG. 1B is a schematic top view showing a sample tube in a cylindrical Halbach magnet array viewed along the symmetry axis of the tube.
Figure 1C:
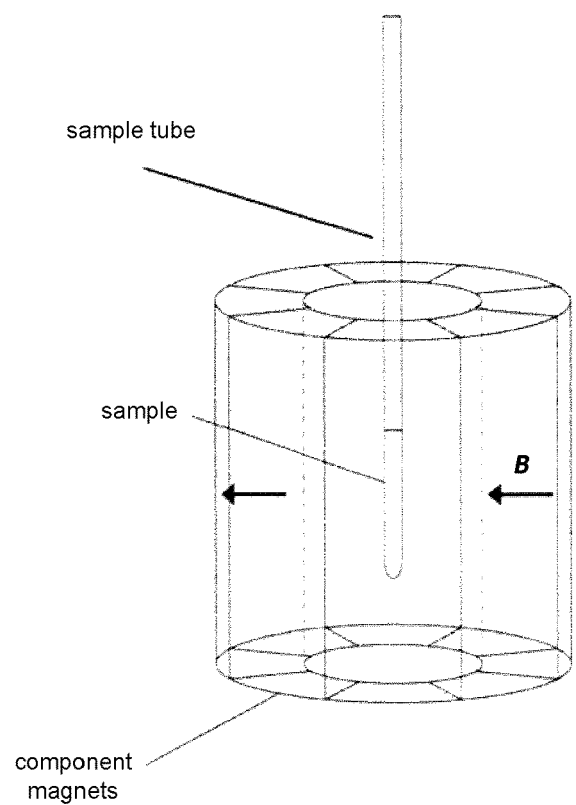
FIG. 1C is a schematic perspective view showing a sample tube in a cylindrical Halbach magnet array viewed along an axis perpendicular to the symmetry axis of the tube.
Figure 2:
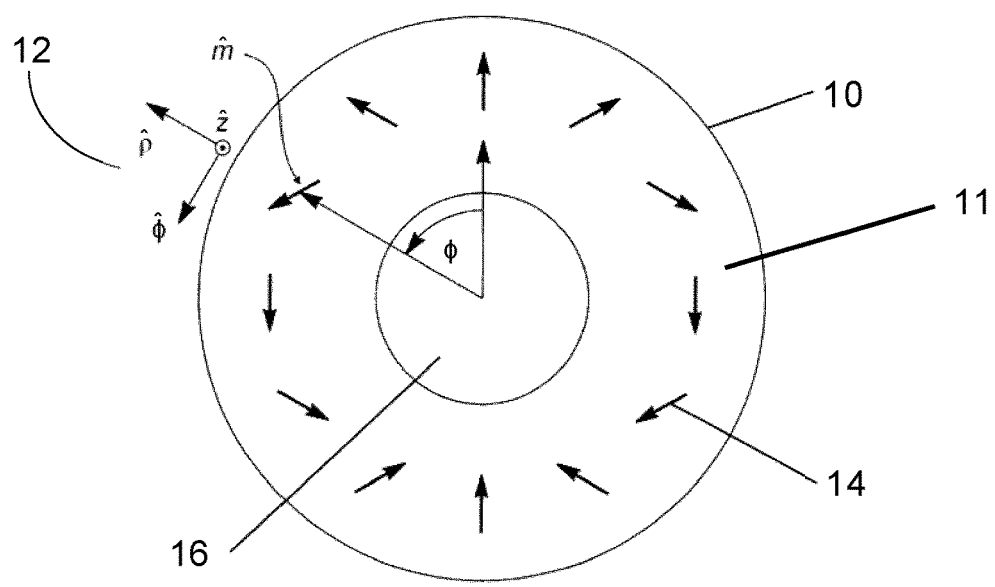
FIG. 2 is a cross-sectional view of an idealized Halbach cylinder.

In the present disclosure, the term Halbach cylinder configuration means a configuration of individual magnets (often called component magnets) disposed around a central volume containing an axis $\hat{z}$, in which the magnetization of each magnet is substantially oriented according to the equation $$\hat{m}(\rho,\varphi,z)=\cos(k\varphi)\hat{\rho}+\sin(k\varphi)\hat{\varphi},$$

where $\rho$, $\varphi$, $z$, are the cylindrical polar coordinates of the center of said individual component magnet relative to an origin location and a preferred axis with $\varphi=0$, and where k is an integer parameter. A magnetization is "substantially oriented" along a direction if it is exactly oriented along that direction or if it is chosen from a finite set of possibilities (such as from the set of directions defined by vectors connecting the vertices or the midpoints of edges or faces of a fixed polyhedron) as the closest approximation thereto. Those skilled in the art will recognize k=1 in the equation as the most prevalent case, which produces a substantially uniform magnetic field, directed along the preferred $\varphi=0$ axis, within a portion of the central volume of the configuration. FIG. 2 shows magnetization vectors 14 selected according to the k=1 case within a region 11 surrounding a central volume 16.

In the present disclosure, the term modified Halbach magnet configuration means a configuration (or arrangement) of individual component magnets that comprises two or more subsets of magnets, at least one subset being configured in a Halbach cylinder magnet configuration and at least one other subset having another (non-Halbach) magnet configuration as discussed in this disclosure. In embodiments of the present disclosure, such modified Halbach magnet configurations provide a design context within which practical implementations of Halbach cylinders can be improved to provide magnetic fields having improved characteristics in applications. A subset of magnets may also be referred to as a plurality of magnets or a group of magnets or a portion of magnets.

Figure 6:
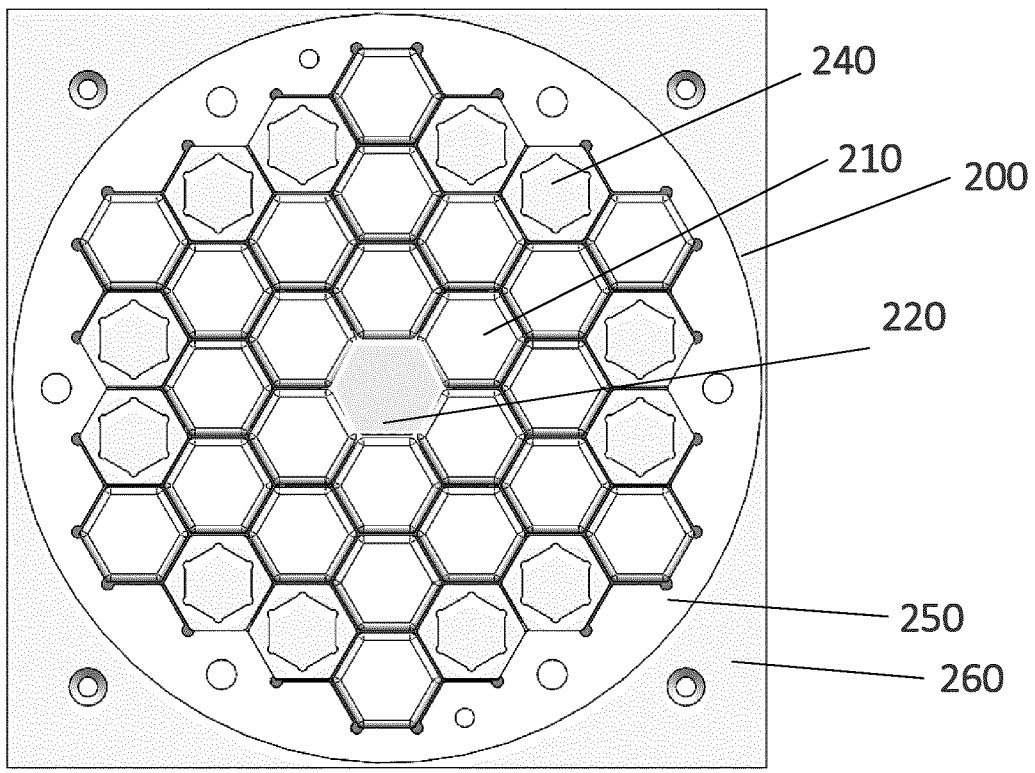
FIG. 6 shows a top view of an embodiment of a magnet configuration.
Figure 8A:
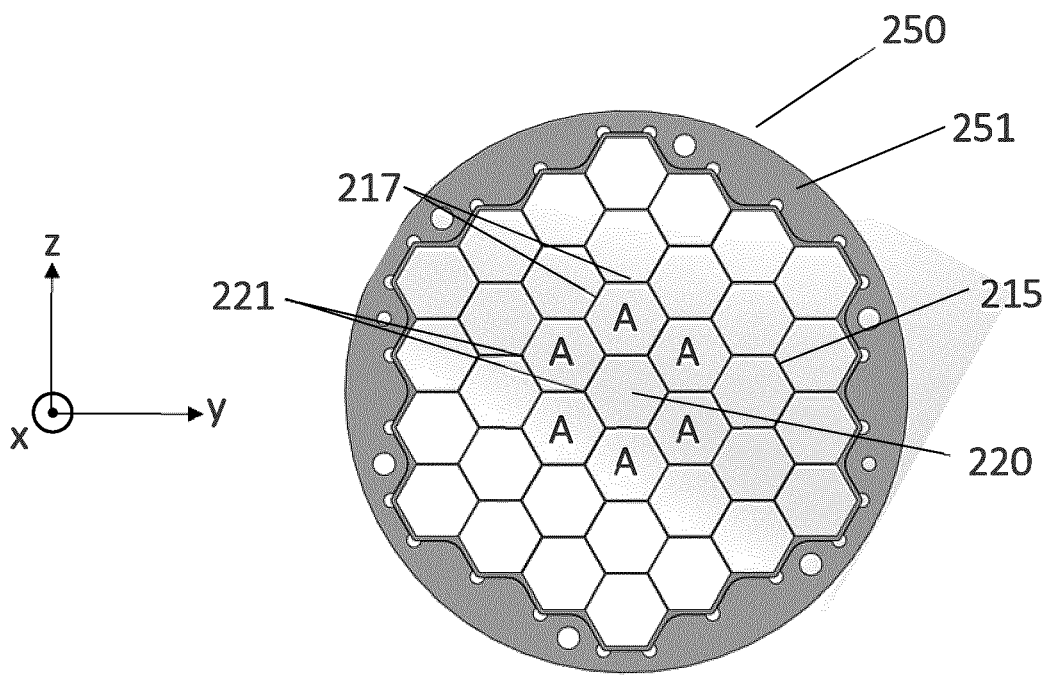
FIG. 8A shows a top view of an embodiment of a magnet cell framework.

In the present disclosure, the term magnet rack means a collection of individual (component) magnets arranged in a holding structure so that their centers lie in a plane. By way of example, FIG. 6 depicts a top view of one embodiment of a magnet rack 250 and individual component magnets 210. As shown in FIG. 8A, magnet rack 250 comprises a cell framework 215 and a framework housing 251. In these examples, the individual component magnets are hexagonal prisms, each of which has a six-fold symmetry axis that is aligned out of the plane of the page. In embodiments, the individual component magnets may be placed so their centers coincide with points in a lattice. In the present disclosure, the term lattice refers to a set of points, each of which is displaced from an origin by a sum of integer multiples of vectors chosen from a basis set $\{\hat{v}_1, \hat{v}_2, \hat{v}_3\}$.

Figure 7A:
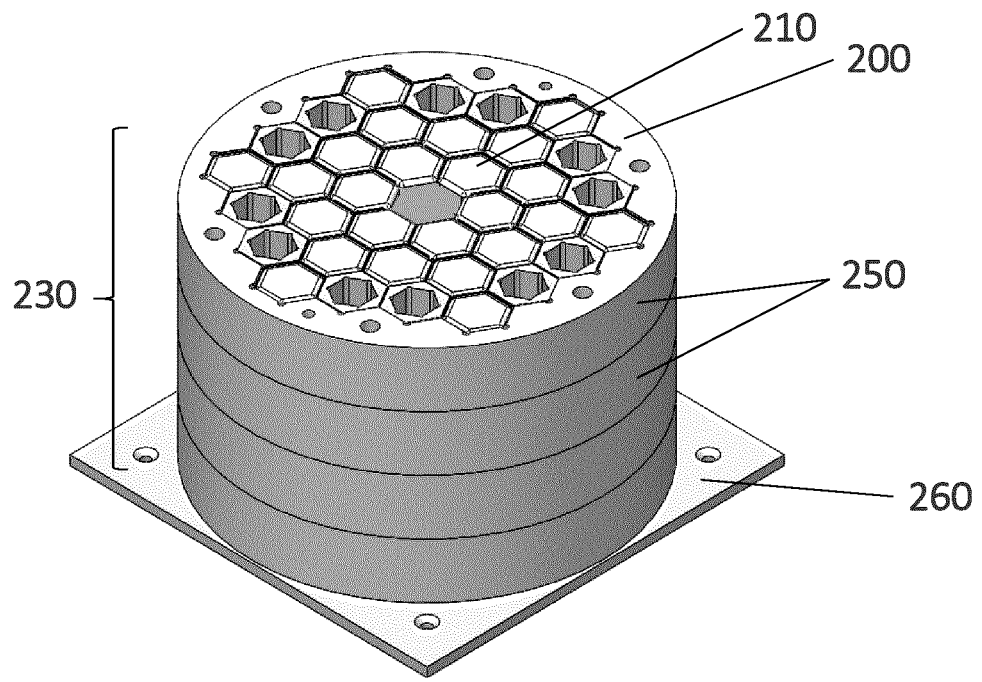
FIG. 7A shows a perspective view of the embodiment of FIG. 6 illustrating four magnet racks in a rack stack.

In the present disclosure, magnet rack stack means a collection of magnet racks that are stacked along an axis that is perpendicular to the said planes containing the centers of the individual component magnets of the magnet racks. By way of example, FIG. 7A shows a perspective view of an embodiment of a rack stack 230, with four magnet racks 250. In embodiments, for example for design or manufacturing purposes, a rack stack may be attached or mounted to additional structures such as a top structure (not shown in FIG. 7A) or a base structure (260 as shown in FIG. 6 and FIG. 7A). In embodiments, a rack stack may contain 1, 2, 3, 4, 5, 6, 7, 8, 9, 10, or any number of magnet racks.

In the present disclosure, individual ones of the polyhedral magnets in a magnet configuration (array) are selected from the group consisting of: a truncated cube; a rhombic dodecahedron; a Platonic solid; an Archimedean solid; a Johnson solid; a prism; a chamfered polyhedron; and a truncated polyhedron. A prism is understood to mean a polyhedron comprising two opposing congruent n-sided polygonal faces with corresponding sides of the polygonal faces joined by n rectangular faces. An example used in this disclosure is a hexagonal prism, wherein n equals 6.

In the present disclosure, a magnetic field gradient is a characteristic of a magnetic field which has a spatial variation in its strength or direction. In many practical applications, and in particular in magnetic resonance applications, a magnet assembly that creates a strong, spatially homogeneous field is desired. In that case, a magnetic field $\vec{B}(x, y, z)$ is well approximated by its projection along an axis, so that the magnetic field is expressed as a scalar value $B_z$, the component of the field along that axis.

In the present disclosure, a quadratic field gradient is a magnetic field gradient in which a component of the field varies in proportion to a second power of some spatial coordinate. For example, a magnetic field having a z component that is substantially of the form $$B_z(x,y,z)=B_0+a(x^2-y^2)+ \ldots$$

possesses a quadratic field gradient due to its spatial dependence on the second power of the coordinates x and y. Note that, in the present disclosure, "bilinear" gradients such as those exhibited by a field of the form $$B_z(x,y,z)=B_0+b(xy)+ \ldots$$

are formally quadratic according to this definition since the function $xy=(u^2-v^2)$ when expressed in the linearly related coordinates $u=\frac{1}{2}(x+y)$ and $v=\frac{1}{2}(x-y)$.

In the present disclosure the term magnetic resonance or MR means resonant reorientation of magnetic moments of a sample in a magnetic field or fields, and includes nuclear magnetic resonance (NMR), electron spin resonance (ESR), magnetic resonance imaging (MRI) and ferromagnetic resonance (FMR). Embodiments may also be applied in ion cyclotron resonance (ICR). In particular applications and embodiments, the apparatuses and methods disclosed are applied to NMR and in embodiments they are applied to NMR spectrometers or to NMR imagers. Materials that display magnetic resonance when exposed to a magnetic field are referred to as magnetically resonant or MR active nuclides or materials.

In the present disclosure the terms primary field, main field, primary magnetic field and main magnetic field mean the magnetic field generated by a magnet array. In one series of embodiments a field strength in the range of 1.0 to 3.0 Tesla is achieved. However, in alternative embodiments, the field strength may be below 1.0 Tesla or above 3.0 Tesla. The field strength will depend on the number of magnet racks, the strength of the individual component magnets, the presence or absence and types of pole pieces, construction materials used, and other variables.

Figure 4A:
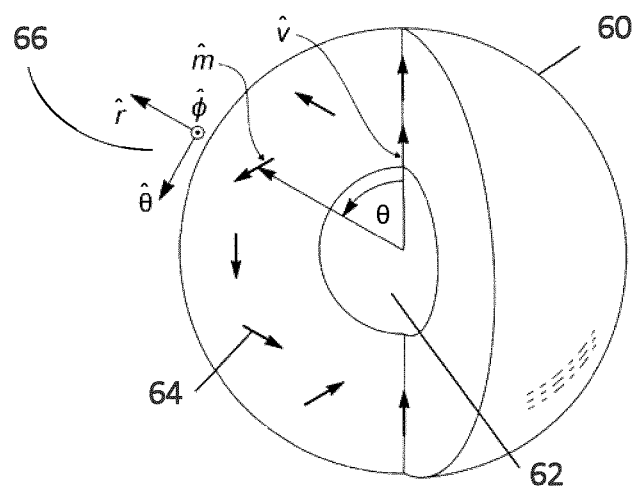
FIG. 4A depicts an idealized magnet configuration for a Halbach sphere.
Figure 4B:
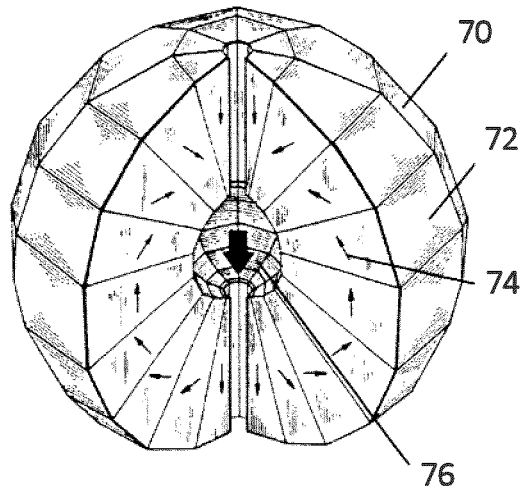
FIG. 4B shows a practical prior art embodiment of a Halbach sphere.
Figures 4C, 5:
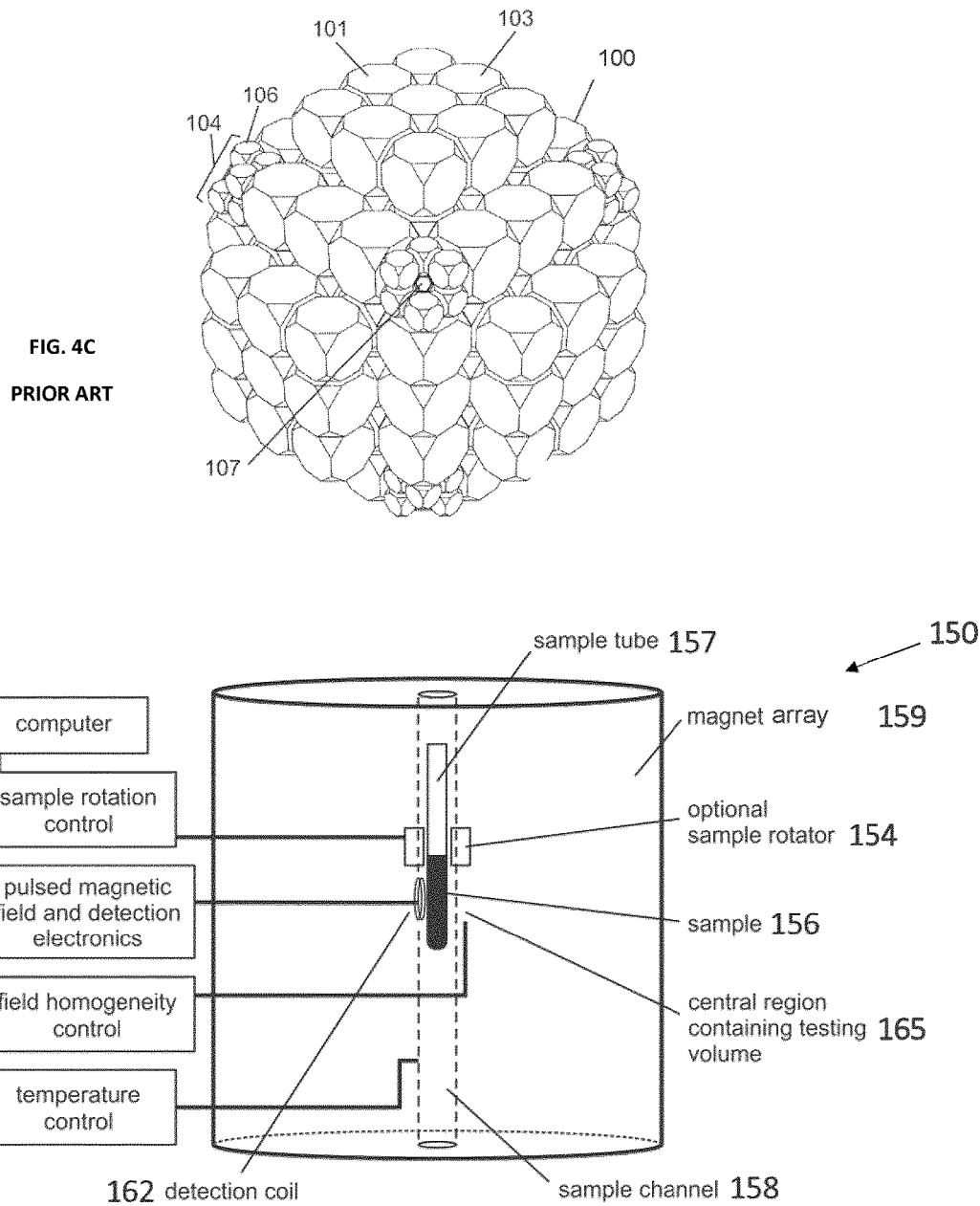
FIG. 4C is a corner view of a prior art embodiment of a magnet assembly based on a lattice configuration of polyhedral magnets.
FIG. 5 shows a block diagram of a magnetic resonance device including a magnet array, in accordance with an embodiment of the disclosure.

In embodiments of this disclosure, the magnet array may be comprised in a magnetic resonance apparatus or device. For example, FIG. 5 is an exemplary block diagram of a magnetic resonance device 150 in accordance with an embodiment of the disclosure. The device 150 comprises a computer 151 operably connected to a sample rotation control module 152 for controlling rotation of an optional sample rotator 154 used for rotating a sample 156 in a sample tube 157 within a sample channel 158 provided in the magnet array 159. The computer 151 may also be operably connected to a pulsed magnetic field control and signal detection module 160 used for controlling a detection coil 162 and receiving a signal therefrom. The device 150 may also include a field homogeneity control module 164 for controlling the magnetic field in a centrally located testing volume 165. A temperature control module 166 may also be provided for controlling the temperature of the magnet array 159 and the temperature inside the channel 158.

In embodiments of the present disclosure, methods are disclosed for building magnet racks, magnet rack stacks, and ultimately magnetic resonance devices comprising magnet arrays. Different terms may be used to describe building magnetic resonance devices based on these magnet arrays, for example, assembling, constructing, producing, manufacturing, or building. These terms refer to building a physical device as opposed to simulating magnet array characteristics.

Magnet Displacements

FIG. 6 shows an example configuration of magnets in a magnet rack 250, shown as a top view. These magnets can be magnetized according to a Halbach cylinder configuration. The magnet array (alternatively known as the magnet assembly) is generally designated 200. For clarity, the magnet array 200 may include magnets in additional magnet racks not shown in FIG. 6. Individual hexagonal magnets 210 form a hexagonal-cylindrical arrangement surrounding a central cavity 220. In FIG. 6, six magnets are shown in closest proximity to the central cavity. Additional magnets are positioned farther away from the central cavity. The size and composition of the individual hexagonal magnets may vary, e.g., some magnets 210 in the array may be larger than other magnets 240 in the array. In the example shown in FIG. 6, the smaller magnets 240 may be oriented at a different angle with respect to the larger magnets 210. The magnets are enclosed by a cell framework in the magnet rack 250, which is positioned on the base 260. In this example, there are 24 larger magnets 210 and twelve smaller magnets 240 in the rack; however, other variations in magnet numbers are possible and more than two types and/or sizes of magnets may be incorporated into the Halbach-based array. In use, a sample will generally be positioned in a defined sample volume, sample space, or testing volume at or close to the center of the central cavity 220.

Figure 3A:
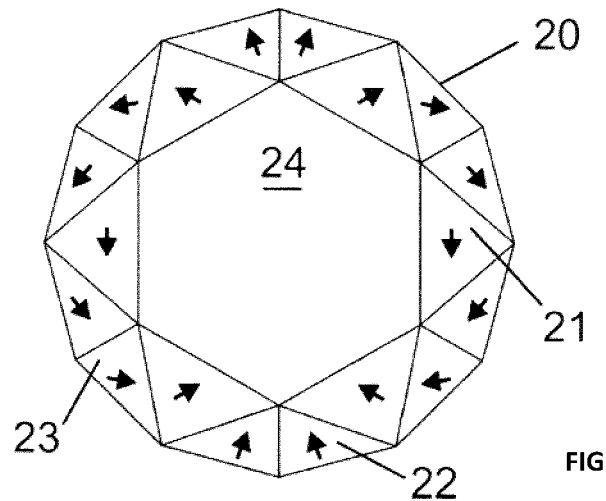
FIGS. 3A-3C are cross-sectional views of implementations of prior art Halbach-cylinder-based magnet assemblies.
Figure 3B:
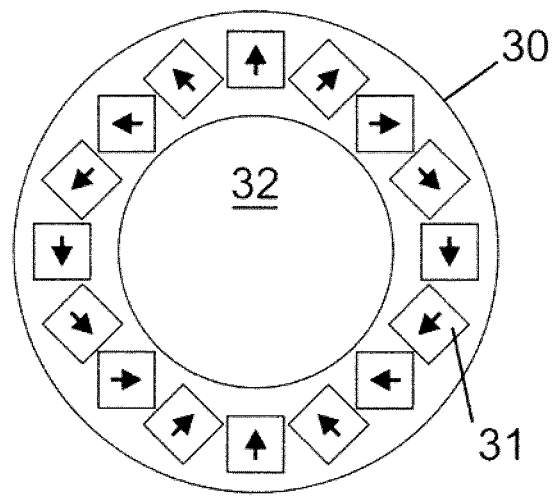
Figure 3C:
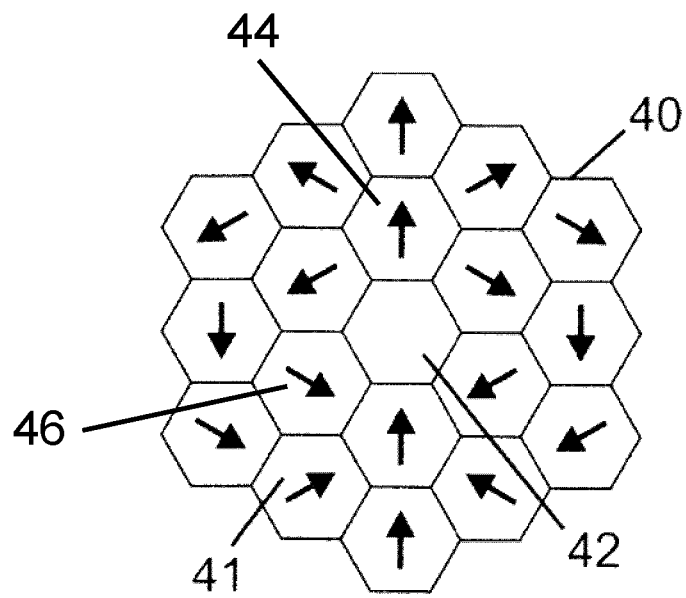
Figure 3D:
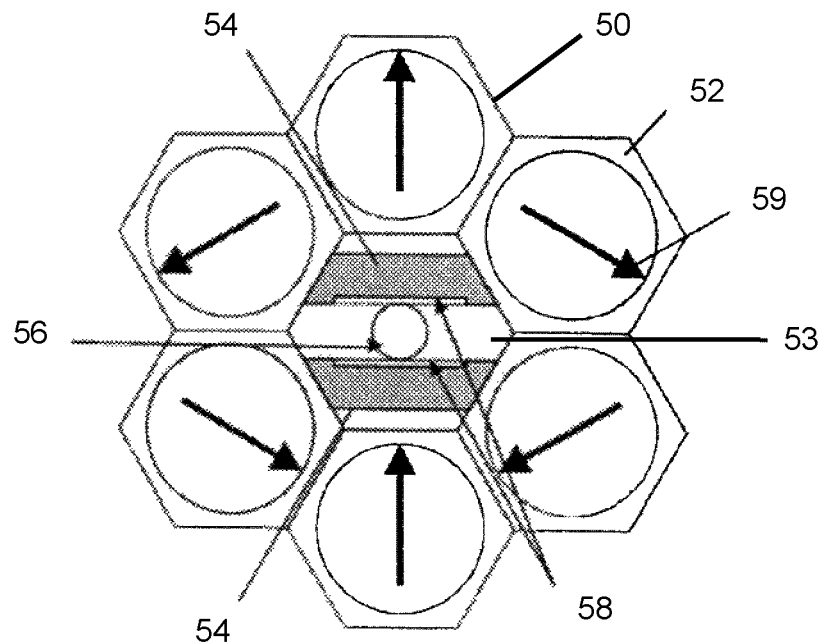
FIG. 3D shows an arrangement of pole pieces and shim panels inside a central cavity within a Halbach cylinder magnet array.

One way to increase the strength of a magnetic field in a magnet array is to use pole pieces, which can acquire a magnetic polarization when placed in a magnetic field. This polarization can increase the strength of the magnetic field in the region of space near the pole piece to a value that is larger than it would be in the absence of the pole piece. Sometimes in applications it is desirable to use pole pieces in pairs rather than individually. FIG. 3D shows a known example configuration of pole pieces 54 within a hexagonal cavity defined by a set of six magnets 52, each of which is in the shape of a hexagonal prism.

Figure 7B:
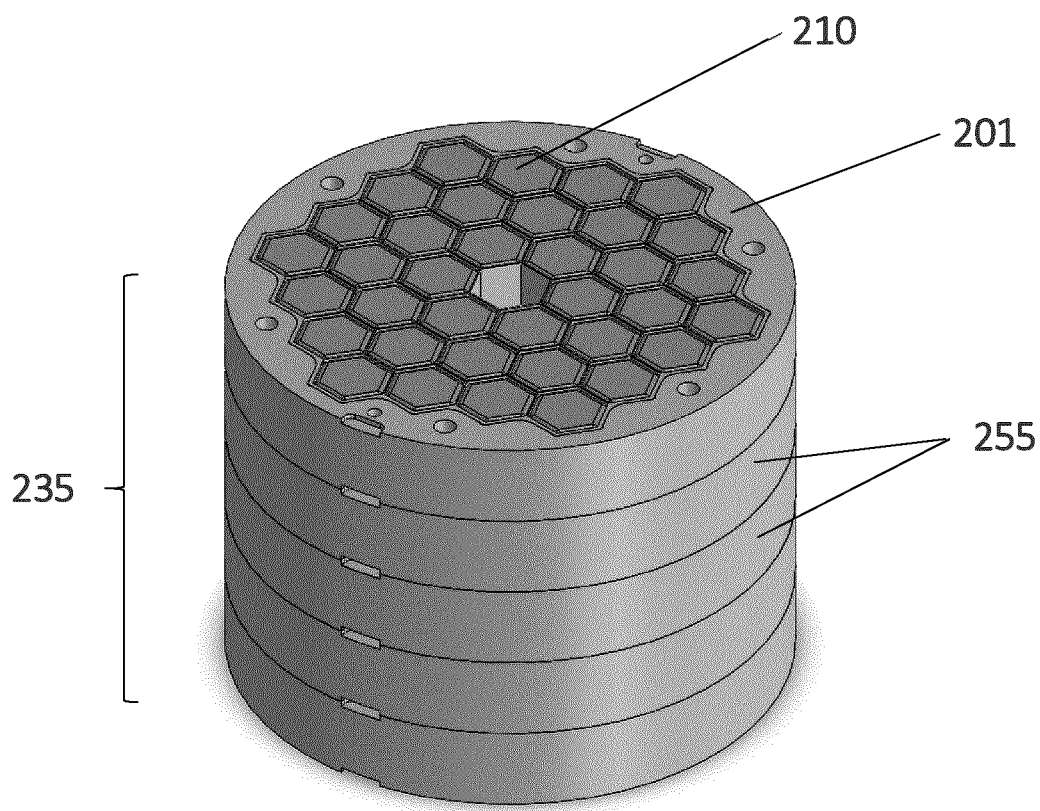
FIG. 7B shows a perspective view of an embodiment of a magnet rack stack comprising five magnet racks.

FIG. 7A is a perspective view of the magnet assembly of FIG. 6, showing a stack 230 of four cylindrical racks 250 above the base 260, with each rack having an arrangement of magnets as shown in FIG. 6. Other numbers of racks, e.g., one, two, three, four, or five racks, can be used, and the magnet arrangement in each rack may be the same or different from the other racks. As an example, FIG. 7B shows a perspective view of a stack 235 of five racks 255. Exposed in the figure is a top rack having an alternative magnet configuration 201 to that which is shown in FIG. 6 and FIG. 7A. As shown in FIG. 7B, thirty-six hexagonal prismatic magnets 210 may be arranged in inner, middle, and outer rings of six, twelve and eighteen hexagonal prismatic magnets, respectively, and with the inner hexagonal prismatic magnets being closest to the central cavity, which in an NMR spectrometer may include a sample testing volume. Just as different numbers of magnet racks may be included in a magnet rack stack, although thirty-six magnets are illustrated in this example, other numbers, arrangements, and types of magnets may be used in a magnet configuration as described herein.

FIG. 8A illustrates a rack 250 comprising a cell framework 215 and a framework housing 251. The cell framework 215 is to be considered a nominal framework in this disclosure against which other frameworks can be compared. An example of a function of the cell framework is to guide the placement of individual component magnets in the magnet rack 250 during assembly of the rack. Another example of a function of the framework is to provide separation between some or all magnets in the rack. In other words, the cell framework defines a number of cells, each cell for receiving an individual component magnet into the magnet rack. In other embodiments, a cell in a cell framework may receive a composite magnet as disclosed herein.

In a non-limiting example, the magnet racks are 1.5" in height, as are the hexagonal prismatic magnets within the racks (1.5" along the six-fold symmetry axis of the hexagonal prism). The cells in the cell framework are 1.25" across (from the midpoint of one edge to the midpoint of the opposing edge across a hexagonal face), and the walls making up the framework itself are 0.030" thick. In alternative embodiments, the magnet dimensions and cell framework dimensions may be larger or smaller depending on the application and the desired magnetic field strength.

As shown in FIG. 8A, the cell framework 215 defines multiple cells, the innermost six of which, surrounding the central cavity, are labelled A for convenience. This framework 215 can accept up to thirty-six magnets positioned around the central cavity 220. The framework 215 includes framework sections 217 which are connected to one another through framework vertices 221. (Note: not all framework sections and vertices are explicitly labelled in the figure.) A Cartesian coordinate axis system is shown in FIG. 8A with the x-axis being directed out of the plane of the page, and this axis system can be understood to carry through FIGS. 8B-8G.

Figure 8B:
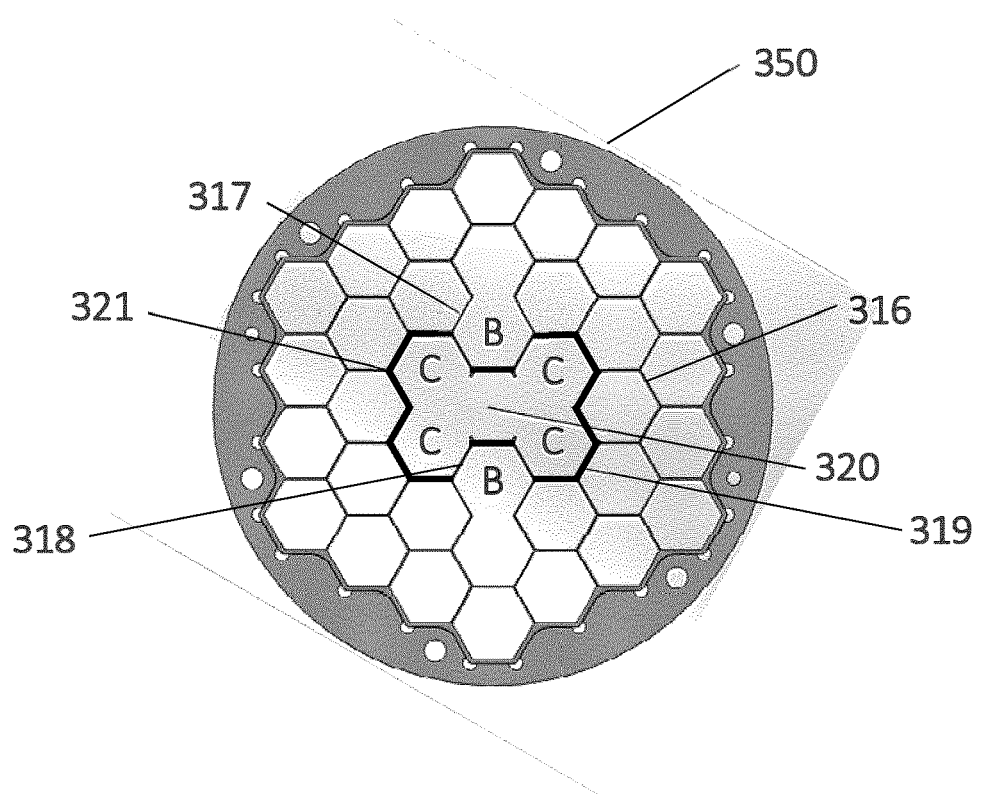
FIG. 8B shows a top view of a further embodiment of a magnet cell framework.

FIG. 8B illustrates a modified cell framework 316 within a rack 350. This framework 316 can also accept up to thirty-six magnets positioned around a central cavity 320. However, framework 316 includes fewer framework sections 317 and fewer framework vertices 321 than are shown in framework 215 in FIG. 8A. In particular, some framework sections between individual magnet cells labelled C, and between magnet cells labelled C and the central cavity of the framework, are absent. This removal permits the magnets placed in cells labelled C to be closer to the central cavity and closer to each other. Moreover, framework sections between cells labelled B and adjacent cells, on the sides of the cells labelled B opposite the central cavity 320, are also removed. This removal permits the magnets placed in cells labelled B to be further away from the central cavity. In embodiments of the present disclosure, framework sections (e.g., section 318) may have a thinner width than other framework sections (e.g., section 319). In a non-limiting example, if the nominal framework wall thickness is 0.030", then this sets the range of displacements to values roughly in the range±0.030". In alternative embodiments, the range of displacements will be similarly constrained by the mechanical characteristics selected for the framework.

Figure 8C:
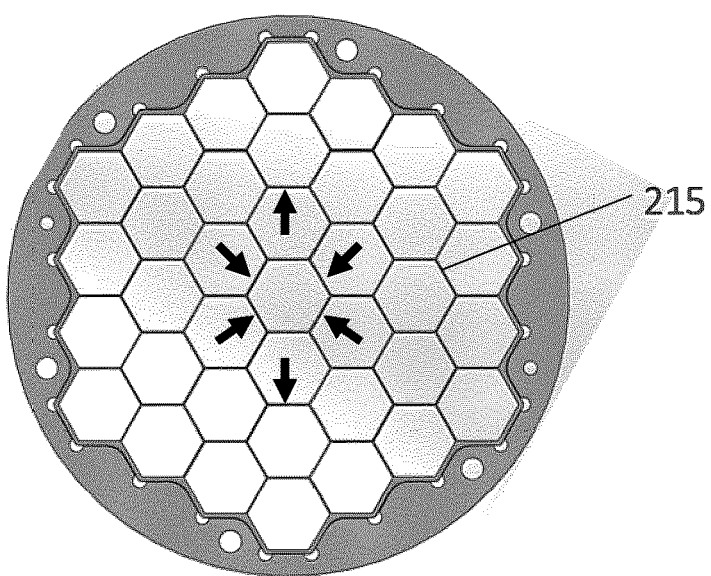
FIG. 8C shows a top view of the embodiment of FIG. 8A, with arrows illustrating how the positions of a subset of magnets would change from respective positions in the embodiment of FIG. 8A to corresponding positions in the embodiment of FIG. 8B.

These in-plane (lateral) displacements of the centers of the magnets from the nominal framework depicted in FIG. 8A may produce a quadratic field gradient opposite in sign to a quadratic field gradient produced by the insertion of pole pieces into the magnet configuration. Therefore, considered placement of component magnets into the framework can be implemented to counteract the quadratic field gradient produced by the pole pieces. FIG. 8C more clearly shows (in the form of arrows) the directions of displacements just described for the framework 316 in FIG. 8B compared to the framework 215 in FIG. 8A.

Figure 8D:
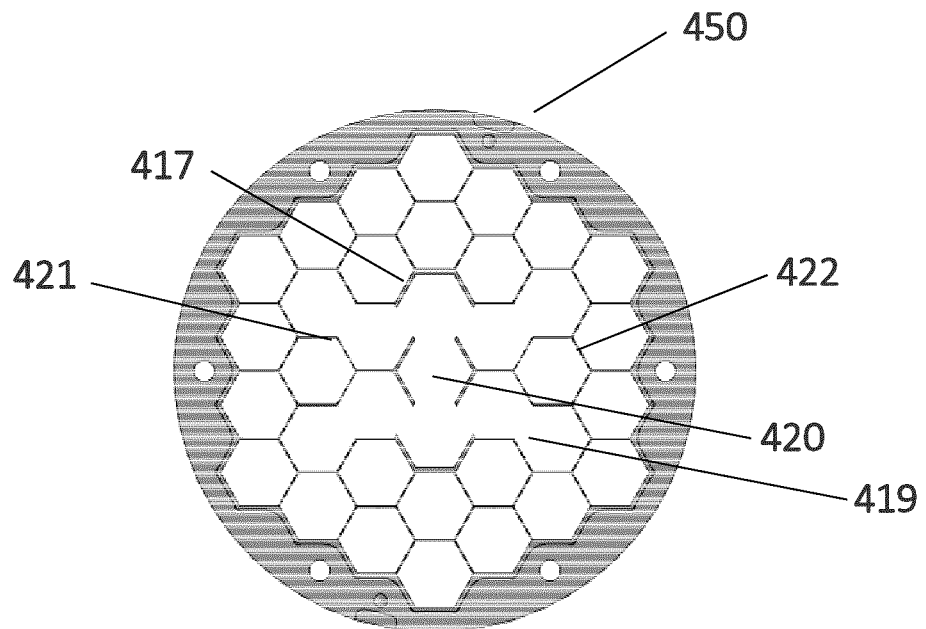
FIG. 8D shows a top view of yet another embodiment of a magnet cell framework.
Figure 8E:
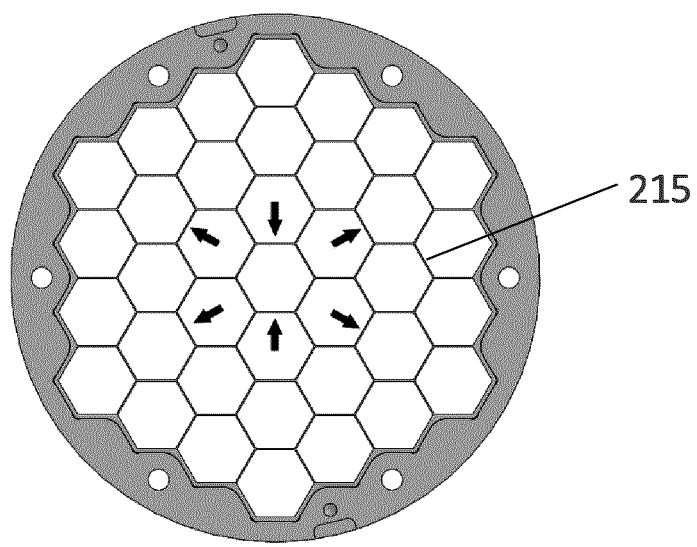
FIG. 8E shows a top view of the embodiment of FIG. 8A, with arrows illustrating how the positions of a subset of magnets would change from respective positions in the embodiment of FIG. 8A to corresponding positions in the embodiment of FIG. 8D.

Alternative modifications to the cell framework can be made to influence the magnetic field and magnetic field gradients. By way of illustration and not limitation, FIG. 8D shows an alternative embodiment of a modified cell framework 422 within a rack 450. This framework 422 can accept a plurality of magnets positioned around a central cavity 420. The framework 422 is different from the framework 316 and from the framework 215. The framework 422 includes fewer framework sections 417 and the same number of framework vertices 421 compared to framework 215. FIG. 8E shows (in the form of arrows) the magnet displacements (the change in magnet positions) effected by the framework shown in FIG. 8D compared to the framework shown in FIG. 8A.

Figure 8F:
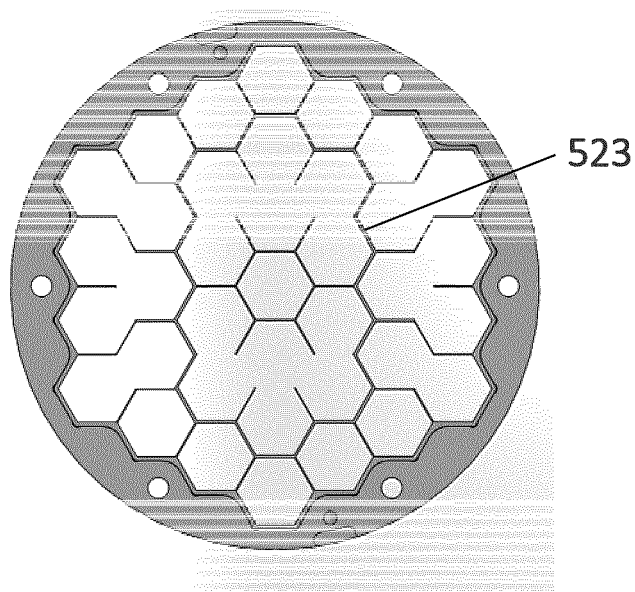
FIG. 8F shows a top view of yet a further embodiment of a magnet cell framework.
Figure 8G:
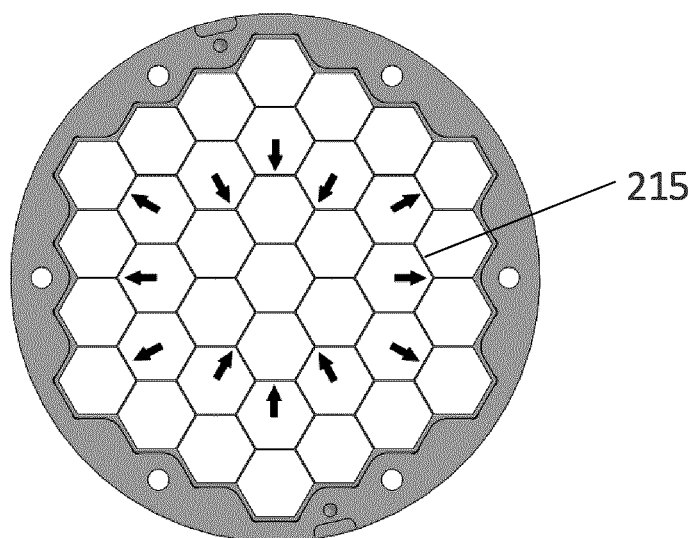
FIG. 8G shows a top view of the embodiment of FIG. 8A, with arrows illustrating how the positions of a subset of magnets would change from respective positions in the embodiment of FIG. 8A to corresponding positions in the embodiment of FIG. 8F.

FIG. 8F illustrates yet a further alternative embodiment of a modified cell framework 523. FIG. 8G shows with arrows how positions of a subset of magnets would change from the framework of FIG. 8A to the framework of FIG. 8F.

The differences in the example frameworks shown in FIGS. 8B, 8D and 8F compared to the nominal framework that is shown in FIG. 8A may be viewed as distortions of the nominal framework. The nominal framework exhibits equal spacing between the magnets, and the distortions can render the spacing between magnets unequal. Such distortions may amplify or diminish certain magnetic field gradients that would be imposed by the insertion of pole pieces, mitigating deleterious consequences of the gradients on the main magnetic field. This capability may allow for a greater range of pole piece shapes compatible with various applications. For instance, the distorted frameworks may counteract deleterious effects on magnetic field gradients of pole pieces positioned in the central cavity and create an overall improvement of magnetic field homogeneity and strength.

Figure 9:
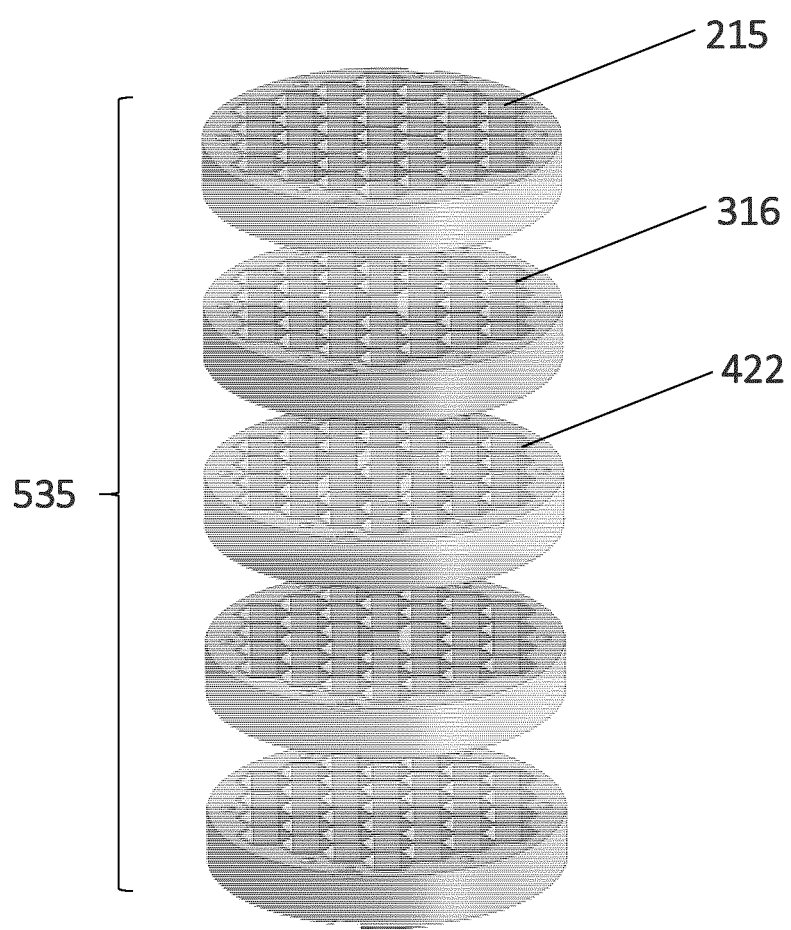
FIG. 9 shows an exploded view of a rack stack comprising multiple magnet racks including the magnet racks of FIGS. 8A, 8B and 8D.

In an embodiment of the present disclosure, a magnet rack stack may comprise individual magnet racks comprising the same framework or different frameworks. Selection of the framework for each individual magnet rack in a magnet rack stack may be determined based on factors such as an understanding of magnetic field gradients of the magnet array (and which of the magnetic field gradients may require suppression), ease of magnet array assembly, cost of assembly, or other technical and/or practical factors. FIG. 9 shows an exploded view of one non-limiting example of a magnet rack stack 535 comprising five magnet racks. The top and bottom (first and fifth when counting from the top) magnet racks are shown to comprise the nominal framework 215 of FIG. 8A, while in this example rack stack 535, two magnet racks (the second and fourth) comprise the distorted framework 316 of FIG. 8B, and the central (third) magnet rack in FIG. 9 comprises the distorted framework 422 of FIG. 8D. While FIG. 9 exhibits a top-to-bottom symmetry that may be advantageous in some applications, other applications may require or benefit from an anti-symmetric or asymmetric arrangement, for example wherein the framework is different in each rack.

The modified Halbach magnet arrays disclosed may be physically assembled (e.g., into a magnet rack, magnet rack stack, or magnetic resonance device). In an embodiment of the present disclosure, a method for assembling a magnet array comprises providing a physical set of polyhedral magnets and providing a cell framework in a magnet rack of the magnet array, the cell framework for receiving the polyhedral magnets. The method comprises arranging these polyhedral magnets in the cell framework in the magnet rack. The centers of the polyhedral magnets in the magnet rack may be arranged substantially in a plane in the magnet rack of the magnet array and such that the polyhedral magnets at least partly enclose a testing volume that would, in use, accommodate a chemical sample for analysis. In this method, a subset of the centers of the polyhedral magnets are laterally displaced (following the structure of the cell framework) from a nominal position in the magnet rack to counteract a magnetic field gradient of the magnet array. The method may further comprise arranging the magnet rack in a rack stack to assemble the magnet array.

The modified Halbach magnet arrays disclosed, including the associated magnet rack and magnet rack stack examples shown in FIGS. 6-9, may be used in a magnetic resonance device, for example, as shown in FIG. 5. The magnetic resonance device may comprise a magnet array comprising a plurality of polyhedral magnets arranged in a Halbach cylinder configuration, the centers of individual ones of the plurality of polyhedral magnets being arranged substantially in a plane in a magnet rack, the plurality of the polyhedral magnets at least partly enclosing a testing volume, and wherein a subset of the centers of the individual ones of the plurality of polyhedral magnets are laterally displaced from a nominal position in the magnet rack to counteract a magnetic field gradient of the magnet array.

Magnet Coercivity

Permanent magnet materials can be subject to magnetic stresses (demagnetizing forces) when the magnets are placed in strong magnetic fields, for example, when magnets are placed so that their magnetization vectors are aligned in opposition with the magnetic fields produced by nearby strong magnets. Magnets that are under such stress can be subject to partial or full demagnetization, and this deleterious effect can be exacerbated at elevated temperatures. The resistance to this effect is quantified for a particular magnetic material by its intrinsic magnetic coercivity (also called intrinsic coercivity) $H_{c,i}$. Often, when the word coercivity is used without qualification, the term is understood to mean intrinsic coercivity. The SI units of coercivity are ampere per meter (A/m) and the cgs units of coercivity are Oersted. It is commonly the case that magnets that have high coercivity (greater resistance to demagnetization) are costly compared to magnets that have low coercivity. To optimize performance and cost in constructing magnet arrays for applications including NMR spectroscopy, it is therefore advantageous to know in what locations within a magnet configuration one may use magnets of high coercivity and in what locations one may use magnets of low coercivity. For example, magnets exhibiting high coercivity may be desirable in locations in a magnet array where magnetic fields are strong and in opposition to the magnetization of the magnets themselves. Such placement of high coercivity magnets may reduce the tendency of magnets in such locations to demagnetize or may increase the practical range of temperatures over which a device incorporating the magnet array may be used.

Commercial manufacturers typically specify magnet materials by grade, and this grade is associated with a coercivity label. For example, one may purchase grades N42, N42M, N42H, N42SH, N42UH, N42EH, and N42AH. The coercivity of each grade increases as one goes through this list. Between successive grades in the list, the coercivity can vary by 20% or more. Within a grade, the coercivity typically varies by less than a few percent. In this disclosure, magnets of "the same" coercivity are understood to mean magnets of the same commercial grade, having a variation in coercivity not exceeding 5% and preferably not exceeding 2%. In this disclosure, magnets of "different" coercivity are understood to mean magnets of different grades, where the difference between the coercivities exceeds at least a threshold of 10% and preferably a threshold of 20%.

Another important characteristic of magnetic materials and component magnets made from these materials is the remanent magnetization. This quantity is the magnetization present in a magnetic material after it has been magnetized during manufacture. Often instead of remanent magnetization a manufacturer, for example, will specify a proportional quantity, the remanent field, Br. Remanent magnetization is important in magnet array design and applications because it effectively characterizes the "strength" of a component magnet and the ability of the magnet to produce a magnetic field at a location outside of the space the magnet occupies.

It is often the case that the strongest available magnets, those having the highest "maximum energy product," the maximum attainable product of the magnetic flux density and the magnetic field strength, are subject to a trade-off between high remanent magnetization and high coercivity. It is therefore an aspect of the present disclosure to use knowledge of overall magnetic fields present within a magnet array, and in particular within the volume occupied by individual component magnets, to identify locations (also referred to as positions or sites in the array) having relatively weak coercive stress in order to select magnets of lower coercivity and low cost (or correspondingly high remanent magnetization) in order to either increase the available overall magnetic field produced within a central testing volume of the array or to reduce the overall cost of a device incorporating the magnet array.

Disclosed herein is a figure of merit, a threshold coercivity $H_T$. The intrinsic coercivity $H_{c,i}$ of the magnetic material to be used for a component magnet at a given site in a magnet array must exceed this threshold coercivity.

At a point $\vec{r}$ inside a magnetic material, three vectorial quantities are defined: the magnetic field intensity $\vec{H}(\vec{r})$, the magnetization $\vec{M}(\vec{r})$, and the magnetic flux density $\vec{B}(\vec{r})$. These are related by the relation $$\vec{H}(\vec{r}) = \frac{1}{\mu_0}\vec{B}(\vec{r}) - \vec{M}(\vec{r}),$$

where $\mu_0$ is the permittivity constant. When a magnet is under coercive stress, $\vec{H}$ and $\vec{M}$ point in roughly opposite directions over a significant portion of the volume within the magnet. In this case, the dot product of these vectors will be negative. Therefore, the criterion for stability in the presence of demagnetizing forces is that the quantity $-\vec{H}\cdot\vec{M}$ not be too large anywhere within the magnet.

Bjørk, et al. have considered the problem of demagnetization in magnet arrays and give $$-\mu_0 \frac{\vec{H}\cdot\vec{M}}{B_r} \geq H_{c,i}$$

as a criterion for estimating when a magnet is under coercive stress large enough to cause demagnetization. (See R. Bjørk, A. Smith, and C. Bahl, "The efficiency and the demagnetization field of a general Halbach cylinder," Journal of Magnetism and Magnetic Materials vol. 384, p. 128, 2015, and especially equation (8) therein.)

For use in reliable magnet products, this criterion is not stringent enough. Magnet assemblies must be robust to temperature changes (for example during shipping of a commercial product) and to tolerances in specifications associated with manufacture of the magnetic materials, component magnets, holding structures, and the like.

To account for such factors, each component magnet having a manufacturer-specified coercivity $H_{c,i}^{\theta_{spec}}$ (given at a specified standard temperature $\theta_{spec}$, for example 20° C.) must satisfy the following inequality:

$$-\mu_0 \frac{\left[\vec{H}(\vec{r})\cdot\vec{M}(\vec{r})\right]_{min}}{B_r} \leq \alpha(1-k\Delta T)H_{c,i}^{\theta_{spec}}$$

where $[\vec{H}(\vec{r})\cdot\vec{M}(\vec{r})]_m$ is the minimum (most negative) value of the dot product $\vec{H}\cdot\vec{M}$ within the magnet, a is a safety factor (for example 90% (0.90)), k is the magnetic material's coercivity temperature coefficient (for example 0.0056° $C.^{-1}$), and $\Delta T$ is the difference between a maximum operating temperature and the standard temperature used in the specification of coercivity. Also disclosed herein is the following equation defining threshold coercivity:

$$H_T = -\mu_0 \frac{\left[\vec{H}(\vec{r})\cdot\vec{M}(\vec{r})\right]_{min}}{\alpha(1-k\Delta T)B_r}.$$

The manufacturer-specified coercivity for a magnet at a given site must exceed $H_T$ for that site to meet the performance criteria mentioned above.

In an embodiment of the present disclosure, a coercivity selection method comprises the steps of:
1. Setting up a magnetostatic simulation with component magnets in specified locations and with the orientation of their magnetization vectors according to a proposed modified Halbach magnet configuration
2. For each component magnet location
   2.1. Choosing a set of points within the magnet volume associated with said magnet location
   2.2. Running said magnetostatic simulation to obtain the field intensity $\vec{H}(\vec{r})$ at each point $\vec{r}$ in said set of points and assigning to $\vec{M}(\vec{r})$ the magnetization $\vec{M}$ associated to the orientation according to the proposed modified Halbach configuration
   2.3. Calculating the product $\vec{H}(\vec{r})\cdot\vec{M}(\vec{r})$ at each point in said set of points
   2.4. Selecting the minimum (most negative) value $[\vec{H}(\vec{r})\cdot\vec{M}(\vec{r})]_{min}$ for said component magnet location
   2.5. Calculating the threshold coercivity $$H_T = -\mu_0 \frac{\left[\vec{H}(\vec{r})\cdot\vec{M}(\vec{r})\right]_{min}}{\alpha(1-k\Delta T)B_r}$$

for said component magnet location
   2.6. Selecting an available (physical) component magnet having a coercivity exceeding $H_T$ for said location Commercially available simulation software can be adapted to perform Step 1. Non-limiting examples of such software include products by COMSOL and products by Ansys, Inc.

In a second embodiment, the steps of the nominal embodiment are preceded by the step (Step 0) of assigning each component magnet location to a symmetry class of locations, with each location related to the other members of its assigned symmetry class by a symmetry element of the assembly as a whole, such as a reflection plane, rotation axis, rotation-reflection axis, or inversion center, or a magnetic reflection plane, magnetic rotation axis, magnetic rotation-reflection axis, or magnetic inversion center. Step 2 of the nominal method is then performed on each symmetry class of locations.

As in the theory of symmetry for magnetic materials (see for example M. Hamermesh, Group Theory and its Application to Physical Problems, Dover, New York, 1989), in this disclosure, the term magnetic symmetry element, which includes magnetic reflection plane, magnetic rotation axis, magnetic rotation-reflection axis, or magnetic inversion center, is understood to mean the corresponding symmetry element followed by reversal of currents and corresponding reversal of the direction of magnetization.

In a further embodiment, replace step 2.6 in the second embodiment with a conditional step (2.6-A) as follows:
(2.6-A) If the threshold coercivity is above a desired maximum coercivity $H_{max}$, then choose an alternate orientation $\vec{M}_{alt}$ for the magnetization at said symmetry class of locations and repeat Step 2. Otherwise select an available (physical) component magnet having a coercivity exceeding $H_T$ for each of said magnets in said symmetry class of locations.

In an embodiment of the present disclosure, a magnet array may comprise two subsets of polyhedral magnets, one subset having magnets of a relatively higher coercivity compared to a second subset of magnets having a relatively lower coercivity. The first subset of polyhedral magnets having the higher coercivities may be positioned closer to a testing volume in the array and the second subset of polyhedral magnets having the lower coercivities may be positioned farther from the testing volume.

The number of polyhedral magnets in the first subset having the higher coercivities, the coercivity values, and the sites within the magnet array in which the first subset is arranged, may be selected according to a simulation such as a magnetostatic simulation. Likewise, the number of polyhedral magnets in the second set having the lower coercivities, the coercivity values, and the sites within the magnet array in which the second subset is arranged, may also be specified by the simulation. The sites in the array that are selected for magnets with elevated coercivity may be determined to coincide with those sites that exhibit stronger demagnetizing forces in the simulation and the sites in the array that are selected for magnets with diminished coercivity may be determined to coincide with those sites that exhibit weaker demagnetizing forces in the simulation. Further examples pertaining to coercivity are discussed in the next section.

Magnetization Vectors

In the present disclosure, a magnet having a magnetization vector lying in the plane defining a magnet rack (for example, in the yz plane shown in FIG. 8A) is said to be diametrically magnetized. A magnet having a magnetization vector perpendicular to the plane of the magnet rack is said to be axially magnetized. A magnet having a magnetization vector that does not lie in the plane, but is not perpendicular to the plane, is said to be obliquely magnetized. A magnet that is either axially magnetized or obliquely magnetized is said to possess out-of-plane magnetization.

Figure 10:
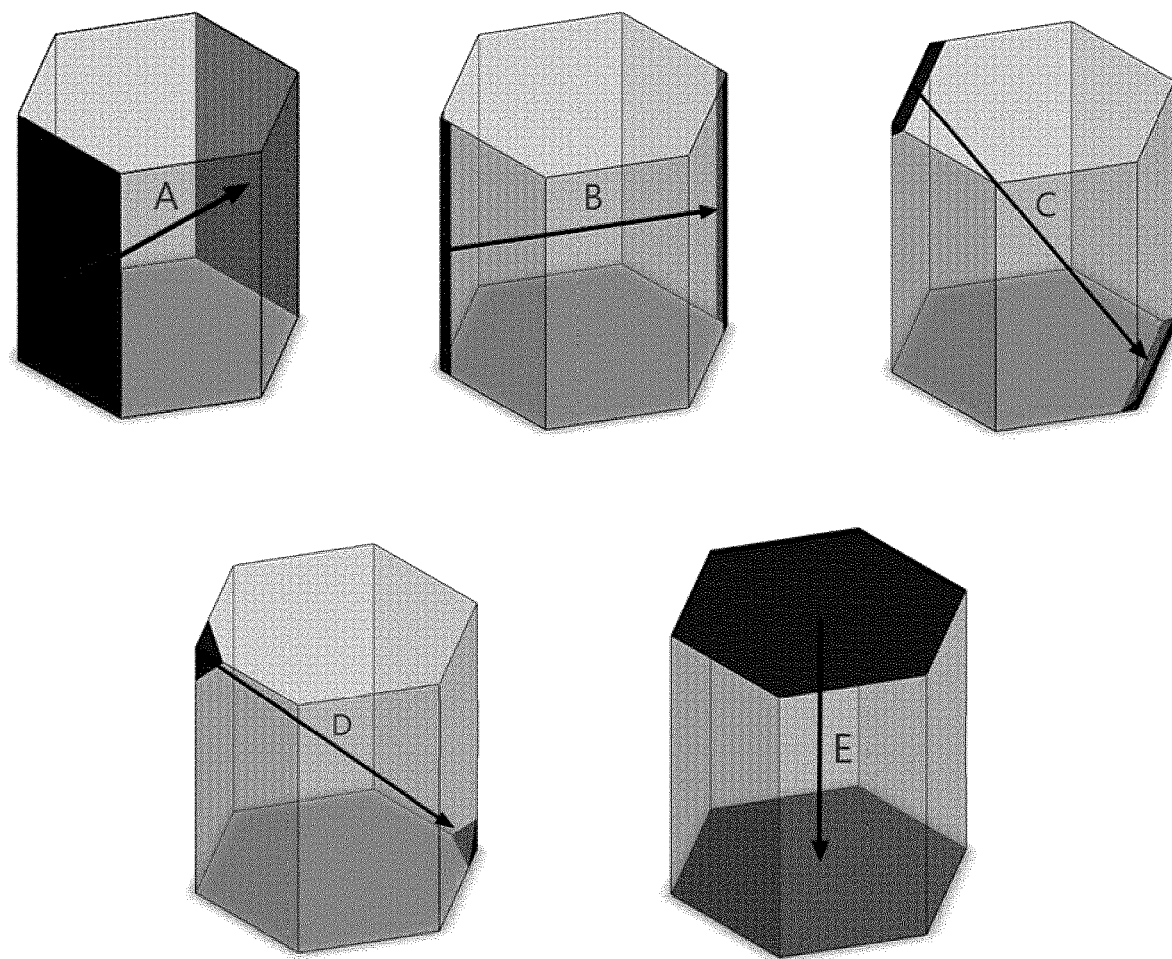
FIG. 10 shows different types of hexagonal prismatic magnets having different magnetization vectors.

FIG. 10 shows examples of magnets that are in the shape of hexagonal prisms. In FIG. 10, magnet A is a diametrically face-magnetized magnet, wherein the magnetization vector (indicated by an arrow) is normal to a rectangular side face of the magnet and perpendicular to the six-fold symmetry axis of the hexagonal face of the magnet. Magnet B is diametrically edge-magnetized, wherein the magnetization vector is perpendicular to the six-fold rotational symmetry axis of the hexagonal face of the magnet and extends from a long edge bounding a rectangular face of the magnet to the opposite edge across the body of the magnet. It will be readily appreciated that this vector is also parallel to certain opposing rectangular faces of the magnet B. FIG. 10 also shows a magnet E, which is axially magnetized, that is, magnetized along a vector that is coincident with the six-fold symmetry axis of the magnet.

Magnets C and D are examples of obliquely magnetized magnets. More precisely, magnet C is obliquely edge magnetized, wherein the magnetization vector extends from the midpoint of one edge bounding a hexagonal face of the magnet to the midpoint of the opposite edge bounding the opposite hexagonal face of the magnet and across the center of the magnet. It will be appreciated from FIG. 10 that the magnetization vector of magnet C is perpendicular to said edges and that the magnetization vector forms an acute angle with the six-fold symmetry axis of magnet C. Magnet D is obliquely vertex magnetized, having a magnetization vector that extends from one vertex, through the center of the magnet, to the opposite vertex. The magnetization vector of magnet D also forms an acute angle with the six-fold symmetry axis of magnet D.

In a Halbach cylinder magnet configuration, such as the ones depicted in FIGS. 1B, 3A-D, and 5, all magnets are diametrically magnetized. That is, the magnetization vectors have only radial and azimuthal components and therefore lie in the plane of a corresponding magnet rack or other holding structure.

In the present disclosure, modified Halbach magnet configurations are described which comprise a first subset of magnets in a Halbach cylinder configuration and a second subset of magnets that may include axially or obliquely magnetized magnets or diametrically magnetized magnets that otherwise deviate from the magnetization prescribed by a strict Halbach cylinder configuration. Including the second subset of magnets with the first subset of magnets may advantageously increase the magnetic field strength within a sample testing volume at least partially enclosed by the magnet configuration.

Figure 11:
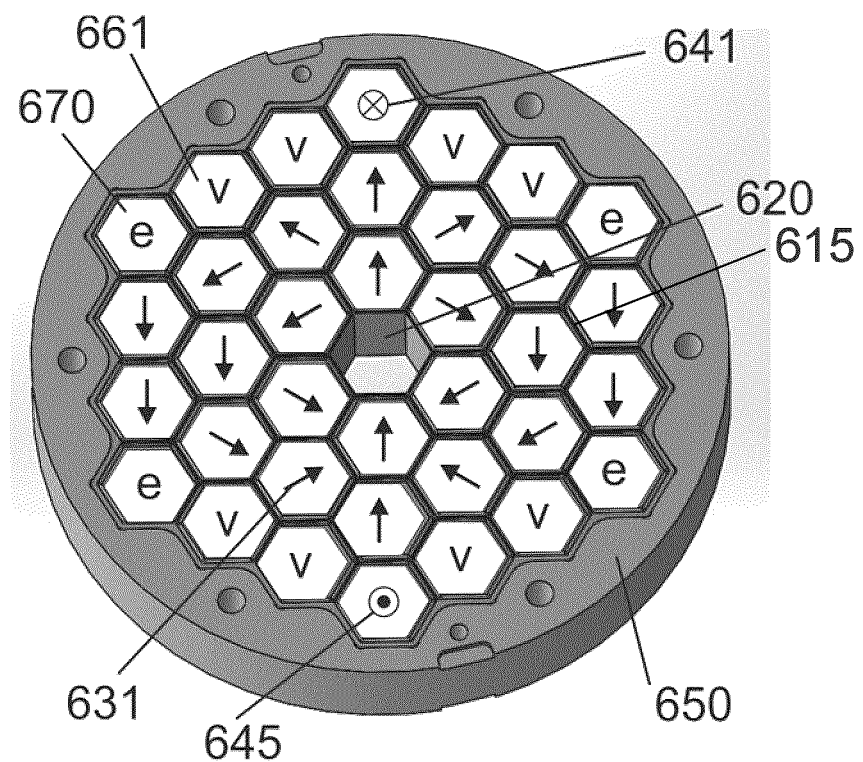
FIG. 11 shows a perspective view of an embodiment of a magnet configuration comprising a subset of magnets, each magnet in the subset having an out-of-plane magnetization.

By way of illustration and not limitation, FIG. 11 shows a rack 650 in perspective view comprising two subsets of hexagonal prismatic magnets according to an embodiment of the present disclosure. The first subset of magnets, shown with black arrows and designated 631, are diametrically magnetized and form a Halbach cylinder configuration around a central volume 620. Magnets in the second of the two subsets are not diametrically magnetized, but, rather, are axially (641 and 645), obliquely-edge (670) and obliquely-vertex (661) magnetized in this example, as shown interspersed within the rack 650. Each magnet is held within the magnet rack 650 at a fixed location by the cell framework 615.

In general, a magnet configuration according to an embodiment of the present disclosure comprises multiple subsets of magnets. A first subset comprises magnets that are diametrically magnetized and oriented according to a Halbach cylinder configuration. A second subset (and further third or fourth or more subsets) of magnets comprise magnets that are not magnetized according to a Halbach cylinder configuration. These second and further subsets comprise magnets that may be magnetized axially, obliquely, or diametrically.

In embodiments, a magnet at displacement $\vec{r}$ within a subset can be chosen so that its magnetization is aligned substantially according to a spherical Halbach configuration, that is, as determined by the formula:

$$\hat{m}=(2(\hat{v}\cdot\vec{r})\vec{r}-(\vec{r}\cdot\vec{r})\hat{v})/(\vec{r}\cdot\vec{r}),$$

where $\hat{v}$ is a preferred field direction, and where $\hat{r}$ is the unit vector pointing along $\vec{r}$. In embodiments the magnetization can be chosen from a finite set of possibilities consistent with limiting the choices of magnet types to a symmetrical set such as those depicted in FIG. 10 for a hexagonal prismatic magnet.

Figure 12A:
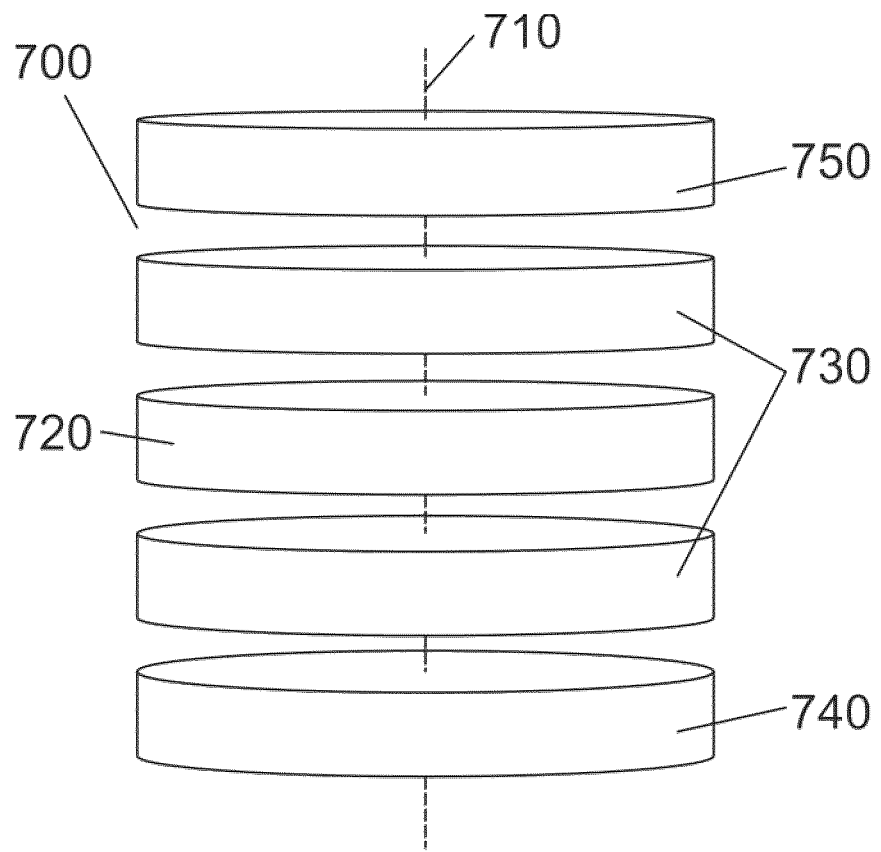
FIG. 12A shows an exploded view of an embodiment of multiple magnet racks in a rack stack.
Figure 12B:
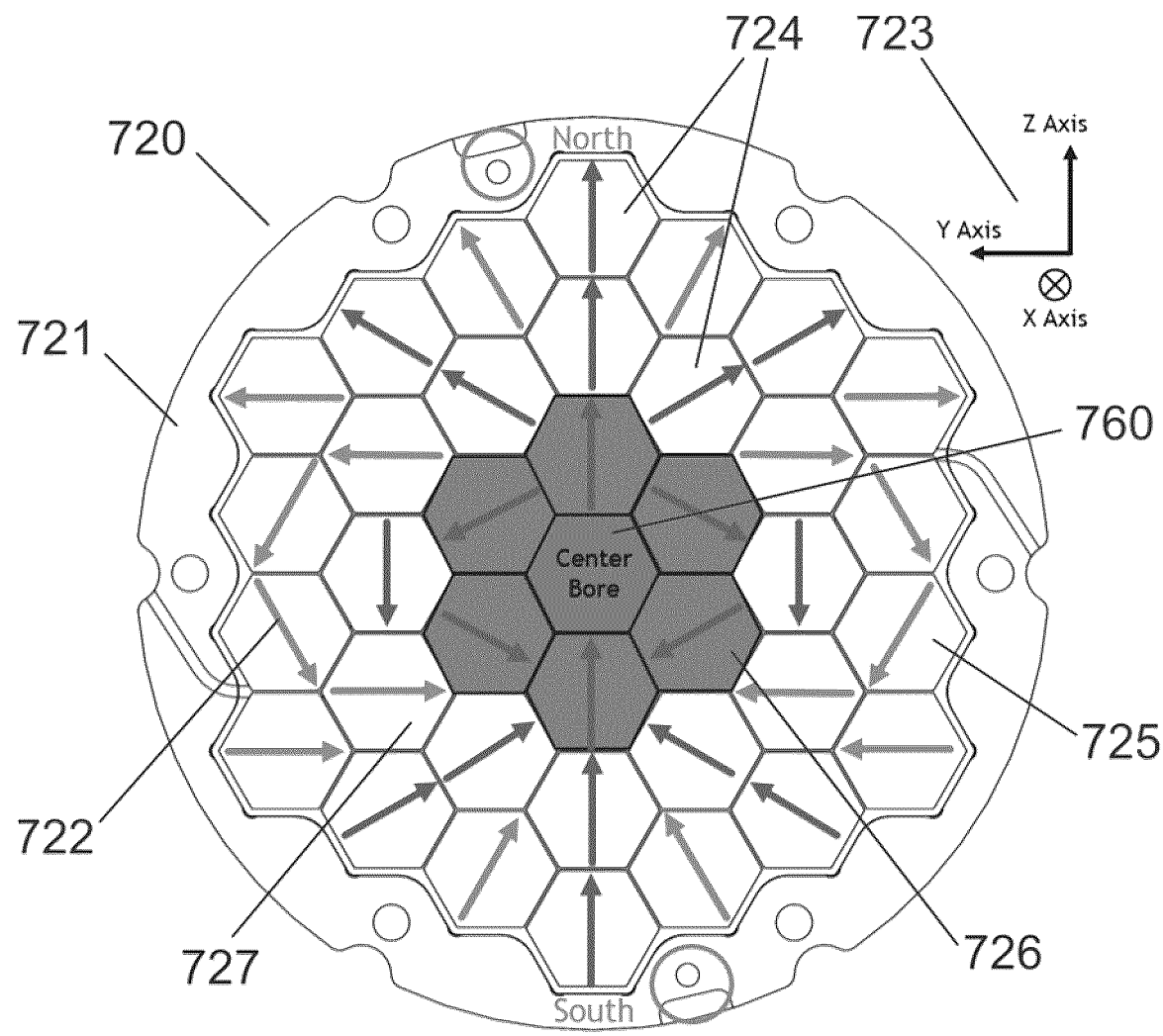
FIG. 12B shows a top view of a third (central) magnet rack of FIG. 12A.
Figure 12C:
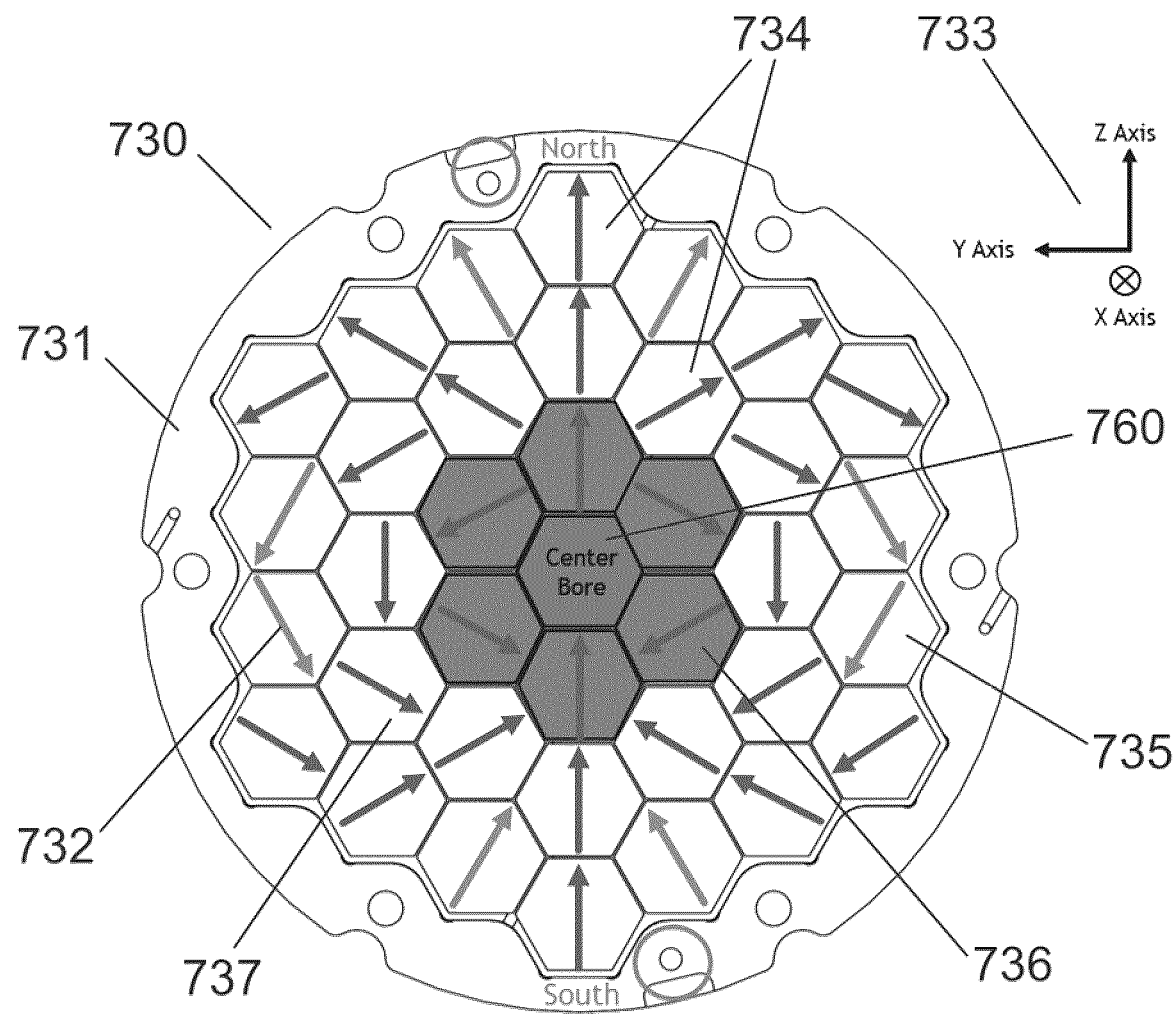
FIG. 12C shows a top view of a second (and fourth) magnet rack of FIG. 12A.

FIGS. 12A-E collectively show an example of a magnet rack stack and associated magnet racks according to an embodiment of the present disclosure. FIG. 12A shows a magnet rack stack 700 of five cylindrical racks in exploded view. The racks are stacked so that their centers align along a central axis 710. The rack stack comprises a first (top) rack 750, two intermediate racks 730 (second and fourth in order from the top of the rack stack), a third (central) rack 720, and a fifth (bottom) rack 740. Each rack is shown in top view in one of FIGS. 12B-E. In this example, the second and fourth racks have the same type and arrangement of magnets, therefore, FIG. 12C shows the two racks' common configuration in top view. While the top and bottom racks (750 and 740, respectively) are different, FIGS. 12D (bottom) and 12E (top) show that these two racks are mirror images of one another, with the mirror plane lying in the center of rack 720 in FIG. 12A and perpendicular to the axis 710. The axis 710 coincides with the x axis exhibited in each of the coordinate frames 723, 733, 743, 753 shown in FIGS. 12B-E, respectively.

FIG. 12B is a top view of central rack 720 of FIG. 12A, and this rack as a whole has a symmetry plane coinciding with the plane of the page in FIG. 12B. Because the second and fourth (intermediate) racks have the same type and arrangement of magnets, and the top and bottom racks are mirror images of one another, the rack stack as a whole (FIG. 12A) exhibits a mirror symmetry plane perpendicular to axis 710 and coinciding with the center of rack 720.

In FIG. 12B, which shows the third (central) rack 720 in top view, hexagonal prismatic component magnets are arranged within a framework housing 721, with a magnetization vector indicated for each magnet in the rack by arrows 722. Some of the magnets, e.g., 724, belong to a subset of magnets that are strictly magnetized along a vector prescribed by a Halbach cylinder configuration. Some of the magnets, e.g., 725, belong to a subset of magnets that are magnetized along a vector that is a closest approximation to a Halbach cylinder configuration given a constraint that the magnetization be chosen from the finite set of possibilities shown for a hexagonal prism in FIG. 10. The six centrally located magnets 726 are shown in a Halbach cylinder configuration, and these magnets belong to a subset of magnets that have elevated coercivity relative to other magnets in the magnet assembly. A further subset of magnets, e.g., 727, exhibit magnetization vectors that do not strictly conform to a Halbach cylinder configuration, but, rather, are reoriented in order to decrease the threshold coercivity for those locations in the magnet rack. At those locations, a reduced threshold coercivity $H_T$ (and magnet expense) is permitted at the cost of a reduced magnetic field in the center bore (central volume) 760 as a result of deviation of the magnets 727 from the strict Halbach cylinder magnetization orientation. Overall, the third (central) magnet rack 720 includes an arrangement of twenty diametrically face magnetized magnets and sixteen diametrically edge magnetized magnets, all of which have in-plane magnetization.

FIG. 12C shows one intermediate (second and fourth) rack 730 in top view. As in central rack 720, in intermediate racks 730, hexagonal prismatic component magnets are arranged within a framework housing 731, with a magnetization vector indicated for each magnet in the rack by arrows 732. A subset of magnets, e.g., 734, are strictly magnetized along a vector prescribed by a Halbach cylinder configuration. Some of the magnets, e.g., 735, belong to a subset of magnets that are magnetized along a vector that is a closest approximation to a Halbach cylinder configuration given a constraint that the magnetization be chosen from the finite set of possibilities shown for a hexagonal prism in FIG. 10. The six centrally located magnets 736 exhibit a Halbach cylinder configuration, and these magnets belong to the subset of magnets that have elevated coercivity relative to other magnets in the magnet assembly. In contrast to FIG. 12B, magnets 737 in magnet rack 730, whose counterparts 727 in the central rack 720 exhibit reoriented magnetization vectors in order to decrease the threshold coercivity $H_T$ for those locations, are not reoriented in FIG. 12C. In the intermediate racks, the threshold coercivity requirement is less stringent than in the central rack. Overall, the second and fourth (intermediate) magnet racks 730 include an arrangement of twenty-eight diametrically face magnetized magnets and eight diametrically edge magnetized magnets, all of which have in-plane magnetization.

Figure 12D:
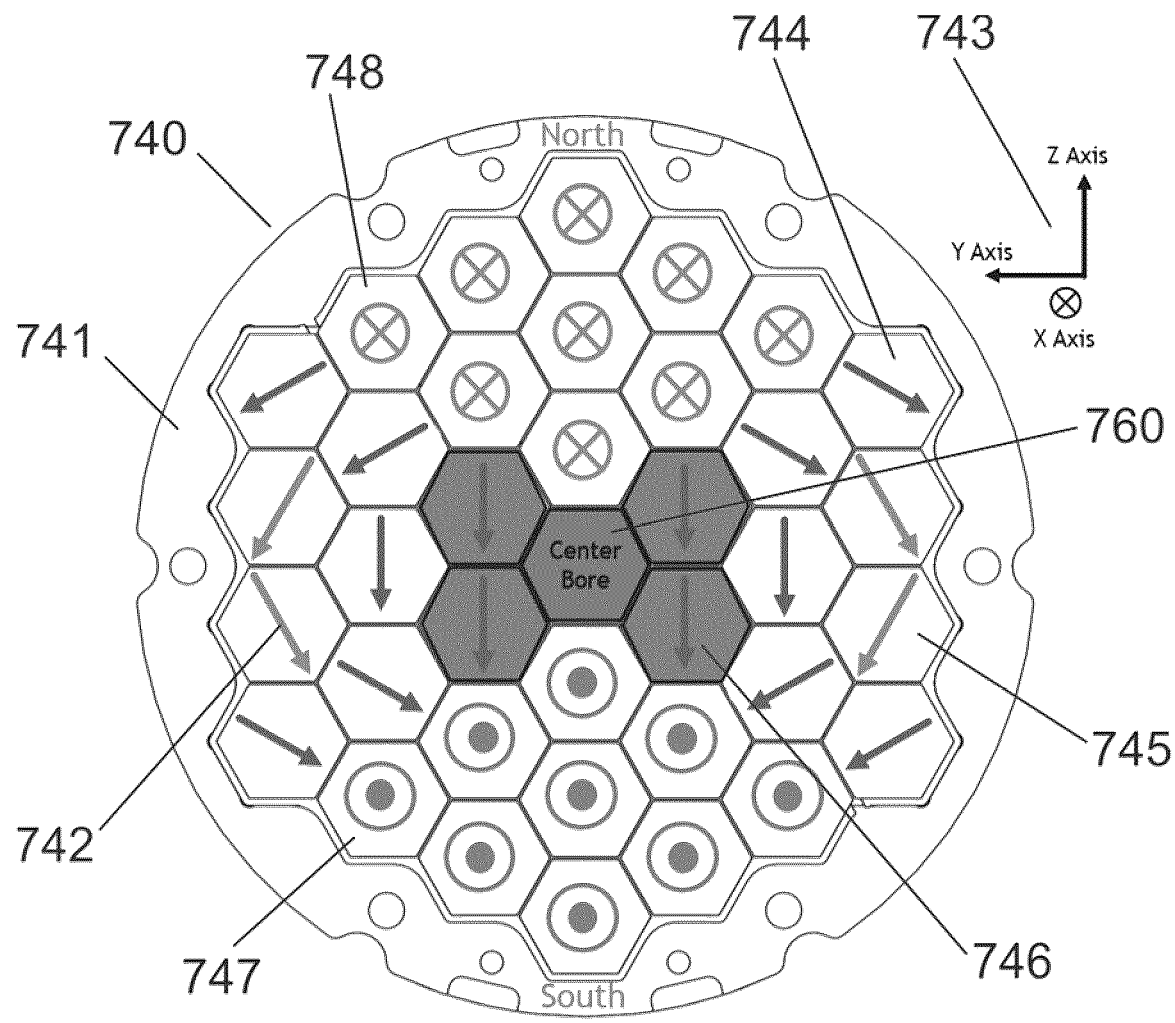
FIG. 12D shows a top view of a fifth (bottom) magnet rack of FIG. 12A.

FIG. 12D shows bottom (fifth) rack 740 in top view. As in the central magnet rack 720 and intermediate racks 730, hexagonal prismatic component magnets are arranged in rack 740 within a framework housing 741, with a magnetization vector indicated for each magnet in the rack by arrows 742. A subset of magnets, e.g., 744, are strictly magnetized along a vector prescribed by a Halbach cylinder configuration. Some of the magnets, e.g., 745, belong to a subset of magnets that are magnetized along a vector that is a closest approximation to a Halbach cylinder configuration given a constraint that the magnetization be chosen from the finite set of possibilities shown for a hexagonal prism in FIG. 10. Two of the six centrally located magnets 746 belong to the subset of magnets that have elevated coercivity relative to other magnets in the magnet assembly. These magnets 746, along with other types of magnets 747 and 748, exhibit magnetization vectors that deviate substantially from their counterparts in the central and intermediate racks 720 and 730, respectively. These magnets 746, 747 and 748, belong to a subset of magnets whose magnetization vectors are determined substantially according to a spherical Halbach configuration and formula. Again, in this context 'substantially' means that the magnetization vectors are selected from the finite set of possibilities exhibited in FIG. 10. Some of the magnets in this subset, e.g., 747 and 748, exhibit magnetizations that are out-of-plane. In particular, these magnets are axially magnetized. In FIG. 12D, this is shown for magnets 748 by a circle enclosing a cross (to indicate magnetization into the plane of the page) and for magnets 747 by a circle enclosing a dot (to indicate magnetization out of the plane of the page).

Figure 12E:
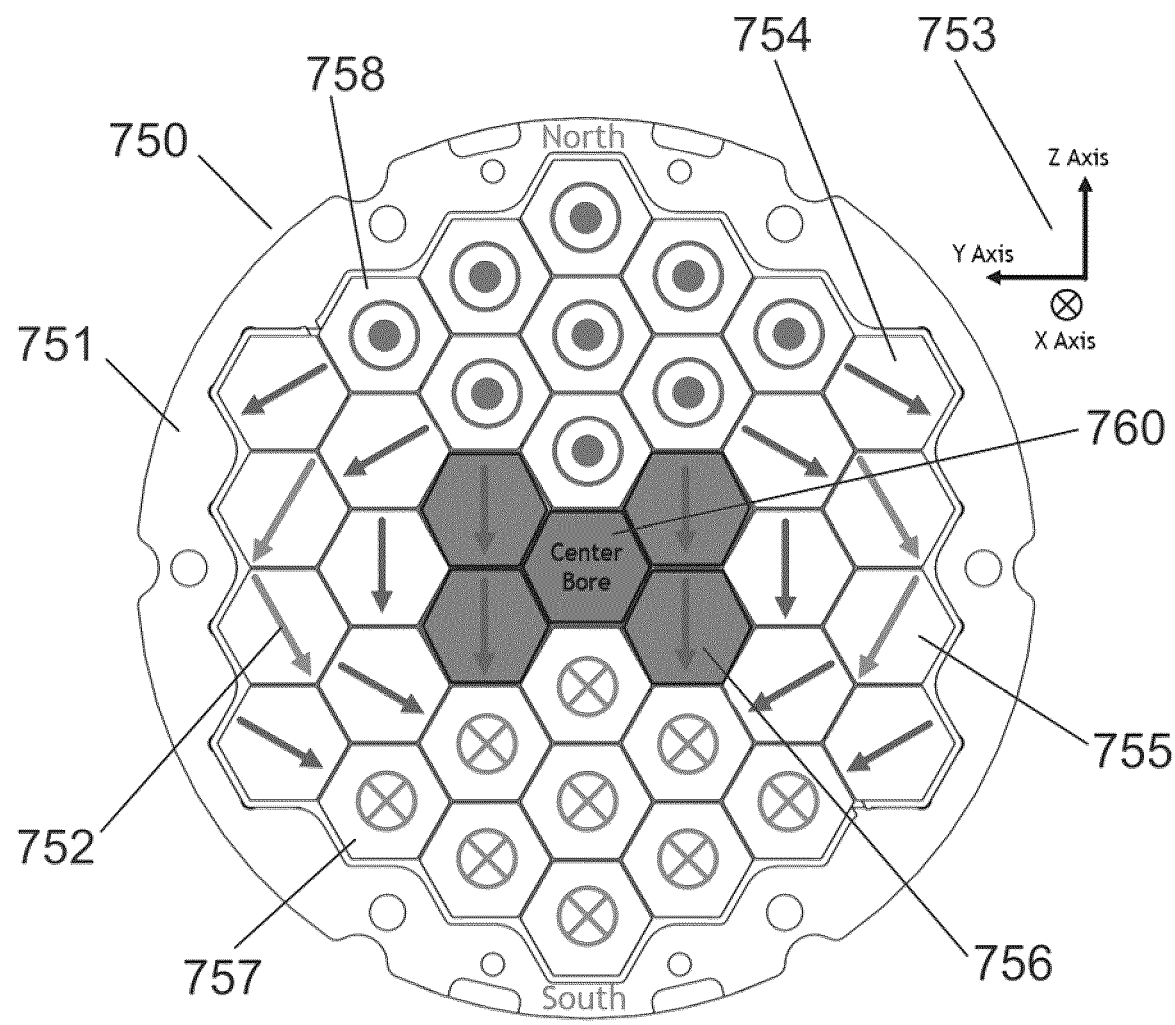
FIG. 12E shows a top view of a first (top) magnet rack of FIG. 12A.

FIG. 12E shows top (first) rack 750 in top view. Magnet rack 750 is the mirror image of magnet rack 740, the mirror plane being the plane of the page, i.e., the yz-plane according to the coordinate axes 743 and 753. Overall, the first and fifth (top 750 and bottom 740, respectively) magnet racks each include an arrangement of fourteen diametrically face magnetized magnets, four diametrically edge magnetized magnets, and 18 axially magnetized magnets. In other words, there are eighteen magnets having an in-plane magnetization vector and eighteen magnets having an out-of-plane magnetization vector in each of the first and fifth racks.

Figure 13:
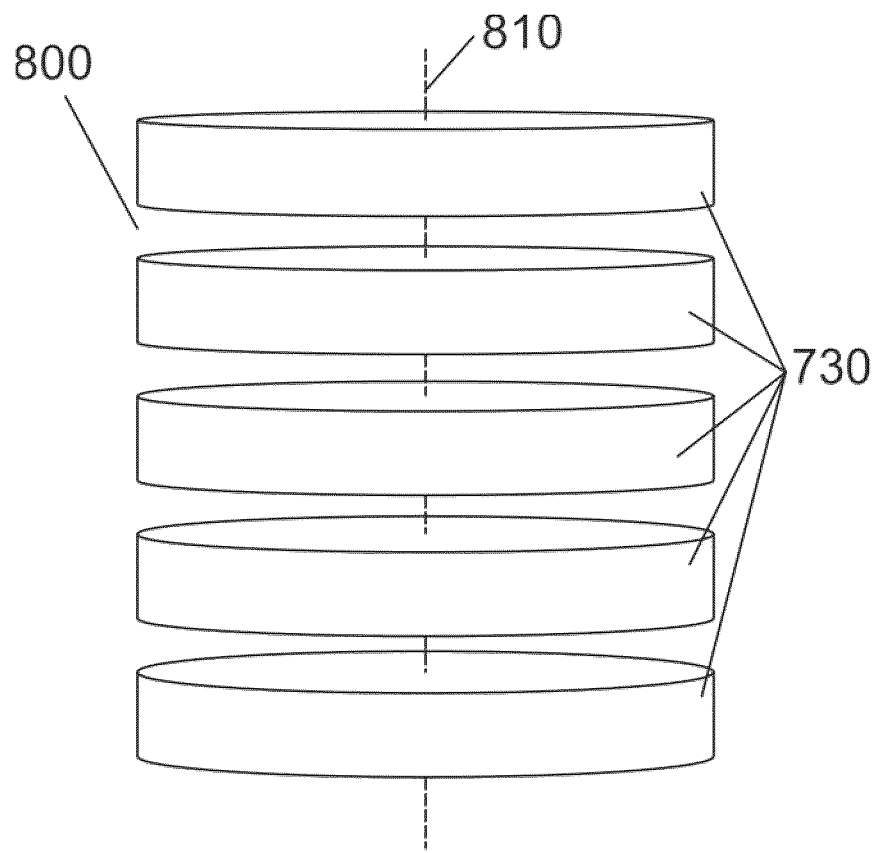
FIG. 13 shows an exploded view of another embodiment of multiple magnet racks in a rack stack.

According to another embodiment of the present disclosure, a further example of a magnet rack stack is provided in exploded view in FIG. 13. In FIG. 13, a rack stack 800 having five identical racks 730 is shown. The racks are aligned with their centers along an axis 810. Returning to FIG. 12C, all component magnets in magnet rack 730 are magnetized substantially in a Halbach cylinder configuration. The magnets are divided (portioned or grouped) into two subsets according to whether their coercivities are relatively elevated (higher) or relatively not elevated (lower).

Figure 14:
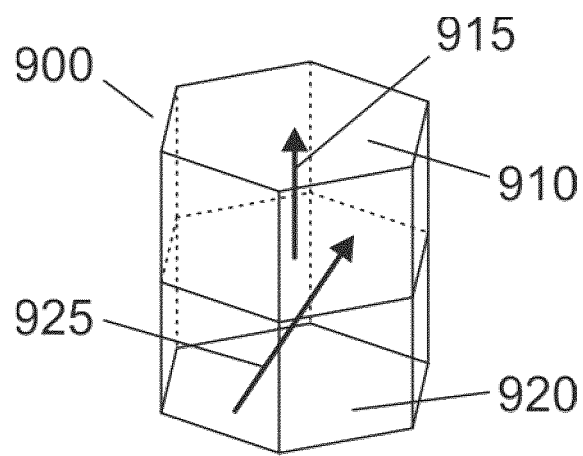
FIG. 14 shows a perspective view of an embodiment of a composite polyhedral magnet.

In the foregoing example embodiments, sites in magnet racks are occupied by polyhedral magnets, in particular hexagonal prismatic magnets. In other embodiments, selected sites may be occupied by pluralities of magnets, wherein said pluralities are together substantially shaped to conform to the shape of the site as a whole. Each magnet in the plurality of magnets may be selected from a finite set of possibilities, such as the set shown in FIG. 10 for the hexagonal prism. FIG. 14 shows an example embodiment in which an overall hexagonal prismatic site 900 is occupied by a plurality containing two smaller hexagonal prismatic magnets 910 and 920. Magnets 910 and 920 have two different magnetization vectors 915 and 925, respectively, and magnet 910 is axially magnetized, whereas magnet 920 is obliquely edge magnetized. In this disclosure, the terms composite magnet and composite polyhedral magnet are understood to mean a plurality of magnets in a cell or lattice site in a magnet assembly where each of the plurality of magnets has its own magnetization vector. The plurality of magnets is together shaped so as to conform to a single cell or lattice site. Use of a composite magnet in a site can increase the effective range of possibilities for the effective average magnetization vector within a cell or lattice site and the corresponding contribution made to the magnetic field within a magnet assembly's testing volume. While FIG. 14 shows a plurality containing two magnets, other composite magnets may include a plurality of more than two magnets.

The modified Halbach magnet arrays disclosed may be physically assembled (e.g., into a magnet rack, magnet rack stack, or magnetic resonance device). In an embodiment of the present disclosure, a method for assembling a magnet array comprises providing a first physical set of polyhedral magnets and arranging these polyhedral magnets in a Halbach cylinder magnet configuration in a magnet rack. The centers of the first physical set of polyhedral magnets in a magnet rack may be arranged substantially in a plane in the magnet array and such that the polyhedral magnets at least partly enclose a testing volume that would, in use, accommodate a chemical sample for analysis. The method further comprises providing a second physical set of polyhedral magnets in the magnet rack and arranging the second set of polyhedral magnets in the magnet rack in a non-Halbach configuration. The method may further comprise arranging the magnet rack in a rack stack to assemble the magnet array.

The modified Halbach magnet arrays disclosed, including the associated magnet rack and magnet rack stack examples shown in FIGS. 11-14, may be used in a magnetic resonance device, for example, as shown in FIG. 5.

The magnetic resonance device may comprise a magnet array comprising a first plurality of polyhedral magnets arranged in a Halbach cylinder configuration, the centers of individual ones of the plurality of polyhedral magnets being arranged substantially in a plane in a magnet rack of the magnet array, the plurality of polyhedral magnets at least partly enclosing a testing volume, and a second plurality of polyhedral magnets in the magnet rack, the second plurality of magnets arranged in a non-Halbach configuration.

The magnetic resonance device may comprise a magnet array comprising a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A magnet array comprising:
a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities;
wherein individual ones of the polyhedral magnets in the first subset have similar magnetic coercivities; and
wherein the individual ones of the polyhedral magnets in a given subset are said to have similar magnetic coercivities relative to one another when a variation in magnetic coercivities associated with the individual ones of the polyhedral magnets in the given subset does not exceed 5%.

2. The magnet array of claim 1, comprising one or more further subsets of polyhedral magnets, wherein each of the subsets of polyhedral magnets have different magnet coercivities, and the individual ones of the polyhedral magnets within each subset have similar magnet coercivities.

3. The magnet array claim 1, wherein the variation in magnetic coercivities associated with the individual ones of the polyhedral magnets in the given subset does not exceed 2%.

4. The magnet array of claim 1, wherein two or more polyhedral magnets or subsets of polyhedral magnets are said to have different magnetic coercivities when a difference between the magnetic coercivities exceeds a threshold of 10%.

5. The magnet array of claim 4, wherein the threshold is 20%.

6. The magnet array of claim 1, wherein the first subset of polyhedral magnets has a higher coercivity than the second subset of polyhedral magnets.

7. The magnet array of claim 6, wherein the first subset of polyhedral magnets having the higher coercivity is positioned closer to the testing volume and the second subset of polyhedral magnets having the lower coercivity is positioned farther from the testing volume.

8. The magnet array of claim 7, comprising thirty-six polyhedral magnets arranged in inner, middle, and outer rings of six, twelve and eighteen hexagonal prismatic magnets, respectively, and with four to six of the inner hexagonal prismatic magnets being closest to the testing volume and having the highest coercivity.

9. The magnet array of claim 6, wherein the number of polyhedral magnets and the location in the magnet array of the polyhedral magnets in the first subset and the second subset are selected according to a simulation.

10. The magnet array of claim 1, wherein each one of the plurality of polyhedral magnets has an intrinsic coercivity $H_{c,i}$ that exceeds a threshold coercivity $H_T$.

11. The magnet array of claim 1, wherein selection of individual ones of the polyhedral magnets defining the first subset and the second subset is based on symmetry considerations associated with magnet positions in the magnet array.

12. The magnet array of claim 1, wherein at least a portion of the polyhedral magnets are arranged in a Halbach configuration.

13. A method of determining a threshold coercivity for one or more magnets in a magnet array comprising a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subsect of polyhedral magnets have different magnetic coercivities, the method comprising:
a. simulating an initial arrangement of the plurality of polyhedral magnets in the magnet array, each individual polyhedral magnet having a given magnet array position and an initial magnetization vector orientation;
b. choosing a set of points $\vec{r}$ within the volume of at least one individual polyhedral magnet in the magnet array;
c. simulating, for the at least one individual polyhedral magnet, a magnetic field intensity $\vec{H}(\vec{r})$ at each one of the points in the set $\vec{r}$, and assigning a magnetization $\vec{M}(\vec{r})$ at each one of the points in the set $\vec{r}$;
d. calculating a dot product $\vec{H}(\vec{r})\cdot\vec{M}(\vec{r})$ at each one of the points in the set $\vec{r}$;
e. selecting the minimum (most negative) value of the dot product $[\vec{H}(\vec{r})\cdot\vec{M}(\vec{r})]_{min}$ for the at least one individual polyhedral magnet in the magnet array; and
f. determining the threshold coercivity according to the formula $$H_\tau = -\mu_0 \frac{\left[\vec{H}(\vec{r})\cdot\vec{M}(\vec{r})\right]_{min}}{\alpha(1-k\Delta T)B_r}$$

for the at least one individual polyhedral magnet in the magnet array.

14. The method of claim 13, further comprising:
before performing step a, determining one or more symmetry classes of the magnet array and assigning each of the plurality of polyhedral magnets in the magnet array to a corresponding one of the symmetry classes; and
assigning the value of the threshold coercivity $H_\tau$ determined in step f to all the magnets in the symmetry class associated with the at least one individual polyhedral magnet.

15. The method of claim 14, wherein each magnet position in a given symmetry class is related to other magnet positions in the same symmetry class by a symmetry element selected from the group consisting of: reflection plane, rotation axis, rotation-reflection axis, inversion center, magnetic reflection plane, magnetic rotation axis, magnetic rotation-reflection axis, and magnetic inversion center.

16. The method of claim 13, further comprising:
identifying a maximum coercivity $H_{max}$ for the at least one individual polyhedral magnet;
selecting an alternative $\vec{M}_{alt}$ to the initial magnetization vector orientation for the at least one individual polyhedral magnet if the threshold coercivity $H_\tau$ calculated in step f. exceeds the maximum coercivity $H_{max}$; and
repeating steps b. through f.

17. A method for assembling a magnet array, comprising:
determining a threshold coercivity $H_\tau$ according to claim 13 for each of the plurality of polyhedral magnets in the given magnet array positions in the magnet array; and
arranging a set of polyhedral magnets in the magnet array, wherein each individual one of the set of polyhedral magnets has a coercivity exceeding the calculated threshold coercivity $H_\tau$ for the given magnet array positions to assemble the magnet array.

18. A magnetic resonance device comprising a magnet array comprising a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities;
wherein individual ones of the polyhedral magnets in the first subset have similar magnetic coercivities; and
wherein the individual ones of the polyhedral magnets in a given subset are said to have similar magnetic coercivities relative to one another when a variation in magnetic coercivities associated with the individual ones of the polyhedral magnets in the given subset does not exceed 5%; and/or
wherein two or more polyhedral magnets or subsets of polyhedral magnets are said to have different magnetic coercivities when a difference between the magnetic coercivities exceeds a threshold of 10%.

19. The magnetic resonance device of claim 18, wherein the first subset of polyhedral magnets has a higher coercivity than the second subset of polyhedral magnets, and wherein the first subset of polyhedral magnets having the higher coercivity is positioned closer to the testing volume and the second subset of polyhedral magnets having the lower coercivity is positioned farther from the testing volume.

20. The magnetic resonance device of claim 18, wherein the threshold is 20%.

21. A magnet array comprising:
a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities;
wherein two or more polyhedral magnets or subsets of polyhedral magnets are said to have different magnetic coercivities when a difference between the magnetic coercivities exceeds a threshold of 10%.

22. The magnet array of claim 21, wherein the threshold is 20%.

23. A magnet array comprising:
a plurality of polyhedral magnets arranged in a magnet configuration, the plurality of polyhedral magnets comprising a first subset of polyhedral magnets and a second subset of polyhedral magnets, the plurality of polyhedral magnets at least partly enclosing a testing volume, and wherein the first subset and the second subset of polyhedral magnets have different magnetic coercivities;
wherein the first subset of polyhedral magnets has a higher coercivity than the second subset of polyhedral magnets; and
wherein the first subset of polyhedral magnets having the higher coercivity is positioned closer to the testing volume and the second subset of polyhedral magnets having the lower coercivity is positioned farther from the testing volume.

* * * * *